United States Patent
Steinfeldt

(10) Patent No.: US 9,758,261 B1
(45) Date of Patent: Sep. 12, 2017

(54) INVERTED METAMORPHIC MULTIJUNCTION SOLAR CELL WITH LIGHTWEIGHT LAMINATE SUBSTRATE

(71) Applicant: SolAero Technologies Corp., Albuquerque, NM (US)

(72) Inventor: Jeffrey Steinfeldt, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 237 days.

(21) Appl. No.: 14/597,566

(22) Filed: Jan. 15, 2015

(51) Int. Cl.
| | |
|---|---|
| B64G 1/44 | (2006.01) |
| H01L 31/041 | (2014.01) |
| H01L 31/0725 | (2012.01) |
| C23C 16/30 | (2006.01) |
| H01L 31/0735 | (2012.01) |
| H01L 31/18 | (2006.01) |

(52) U.S. Cl.
CPC ............ B64G 1/443 (2013.01); C23C 16/301 (2013.01); H01L 31/041 (2014.12); H01L 31/0725 (2013.01); H01L 31/0735 (2013.01); H01L 31/1844 (2013.01); H01L 31/1892 (2013.01)

(58) Field of Classification Search
USPC ........................................................ 438/455
See application file for complete search history.

(56) References Cited

U.S. PATENT DOCUMENTS

| | | | | |
|---|---|---|---|---|
| 4,965,145 A | * | 10/1990 | Rogers | .................... H01M 4/86 429/101 |
| 5,389,459 A | * | 2/1995 | Hall | ...................... H01M 12/08 429/101 |
| 6,198,091 B1 | * | 3/2001 | Forrest | ................... B82Y 10/00 136/263 |
| 6,951,819 B2 | | 10/2005 | Iles et al. | |
| 7,727,795 B2 | | 6/2010 | Stan et al. | |
| 7,741,146 B2 | | 6/2010 | Cornfeld et al. | |
| 7,785,989 B2 | | 8/2010 | Sharps et al. | |
| 7,960,201 B2 | | 6/2011 | Cornfeld et al. | |
| 8,039,291 B2 | | 10/2011 | Cornfeld et al. | |
| 8,187,907 B1 | | 5/2012 | Newman | |
| 8,236,600 B2 | | 8/2012 | Cornfeld | |

(Continued)

FOREIGN PATENT DOCUMENTS

EP        0812025 B1  * 10/1997  .............. H01P 1/203

OTHER PUBLICATIONS

U.S. Appl. No. 12/708,361, filed Feb. 18, 2010, Cornfeld et al.

(Continued)

*Primary Examiner* — Marcos D Pizarro
*Assistant Examiner* — Lawrence Tynes, Jr.

(57) ABSTRACT

A method of manufacturing a solar cell assembly by providing a substrate; depositing on the substrate a sequence of layers of semiconductor material forming a solar cell; mounting a permanent laminate supporting member with a thickness of 50 microns or less on top of the sequence of layers; utilizing the laminate structure for supporting the epitaxial sequence of layers of semiconductor material forming a solar cell during the processes of removing the substrate and depositing and lithographically patterning a plurality of metal grid lines disposed on the top surface of the first solar subcell, and attaching a cover glass over at least the grid lines of the solar cell.

17 Claims, 22 Drawing Sheets

(56) References Cited

U.S. PATENT DOCUMENTS

| | | |
|---|---|---|
| 8,263,853 B2 | 9/2012 | Varghese |
| 8,513,518 B2 | 8/2013 | McGlynn et al. |
| 8,536,445 B2 | 9/2013 | Cornfeld et al. |
| 8,686,282 B2 | 4/2014 | McGlynn et al. |
| 8,778,199 B2 | 7/2014 | Cornfeld et al. |
| 8,895,342 B2 | 11/2014 | Stan et al. |
| 9,018,519 B1 | 4/2015 | Cornfeld et al. |
| 9,018,521 B1 | 4/2015 | Cornfeld |
| 9,117,966 B2 | 8/2015 | Cornfeld et al. |
| 9,287,438 B1 * | 3/2016 | Varghese ............ H01L 31/1844 |
| 2008/0029151 A1 | 2/2008 | McGlynn et al. |
| 2009/0078308 A1 | 3/2009 | Varghese et al. |
| 2009/0078309 A1 | 3/2009 | Cornfeld et al. |
| 2009/0078310 A1 | 3/2009 | Stan et al. |
| 2009/0155952 A1 | 6/2009 | Stan et al. |
| 2009/0229662 A1 | 9/2009 | Stan et al. |
| 2009/0272430 A1 | 11/2009 | Cornfeld et al. |
| 2009/0272438 A1 | 11/2009 | Cornfeld |
| 2009/0288703 A1 | 11/2009 | Stan et al. |
| 2010/0012174 A1 | 1/2010 | Varghese et al. |
| 2010/0012175 A1 | 1/2010 | Varghese et al. |
| 2010/0041178 A1 * | 2/2010 | Cornfeld ............ H01L 31/06875 438/93 |
| 2010/0093127 A1 | 4/2010 | Sharps et al. |
| 2010/0116327 A1 | 5/2010 | Cornfeld |
| 2010/0122724 A1 | 5/2010 | Cornfeld et al. |
| 2010/0122764 A1 | 5/2010 | Newman |
| 2010/0148318 A1 * | 6/2010 | Wang ................ H01L 31/0236 257/627 |
| 2010/0151618 A1 | 6/2010 | Sharps et al. |
| 2010/0186804 A1 | 7/2010 | Cornfeld |
| 2010/0203730 A1 | 8/2010 | Cornfeld et al. |
| 2010/0229913 A1 | 9/2010 | Cornfeld |
| 2010/0229926 A1 | 9/2010 | Newman et al. |
| 2010/0229933 A1 | 9/2010 | Cornfeld |
| 2010/0233838 A1 | 9/2010 | Varghese |
| 2011/0041898 A1 | 2/2011 | Cornfeld |
| 2011/0123866 A1 * | 5/2011 | Pan ........................ H01M 2/16 429/221 |
| 2012/0132250 A1 | 5/2012 | Cornfeld |
| 2012/0211047 A1 | 8/2012 | Cornfeld |

OTHER PUBLICATIONS

U.S. Appl. No. 12/813,408, filed Jun. 10, 2010, Patel et al.
U.S. Appl. No. 12/844,673, filed Jul. 27, 2010, Stan et al.
U.S. Appl. No. 13/569,794, filed Aug. 8, 2012, Stan et al.
Stringfellow, *Organometallic Vapor-Phase Epitaxy: Theory and Practice*, Academic Press, Inc., San Diego, CA, 1989. Title page, copyright page, and Preface; 5 pgs.
Wanlass et al., "Lattice-Mismatched Approaches for High-Performance, III-V Photovoltaic Energy Converters," Proceedings of the 31$^{st}$ IEEE PVSC, Jan. 3-7, 2005, Lake Buena Vista, FL, USA; pp. 530-535.

* cited by examiner

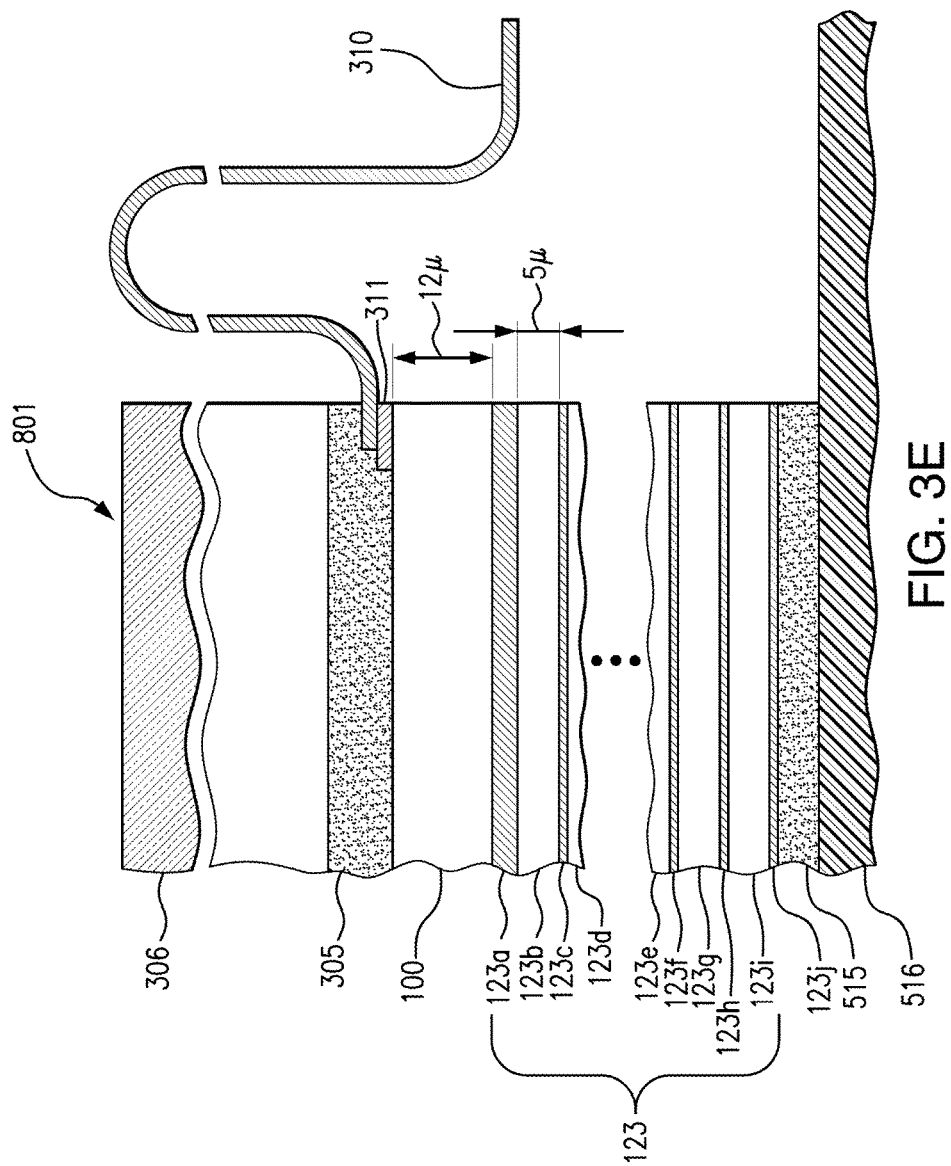

INVERTED METAMORPHIC MULTIJUNCTION SOLAR CELL WITH LIGHTWEIGHT LAMINATE SUBSTRATE

REFERENCE TO RELATED APPLICATIONS

This application is related to co-pending U.S. patent application Ser. No. 13/569,794, filed Aug. 9, 2012, which is a continuation-in-part of co-pending U.S. patent application Ser. No. 12/844,673, filed Jul. 27, 2010, which is in turn a continuation-in-part of co-pending U.S. patent application Ser. No. 11/860,142, filed Sep. 24, 2007.

This application is also related to co-pending U.S. patent application Ser. No. 13/315,877, filed Dec. 9, 2011, which is in turn is a continuation of U.S. patent application Ser. No. 12/362,213, filed on Jan. 29, 2009, and which is in turn is a continuation-in-part of co-pending U.S. patent application Ser. No. 11/445,793, filed Jun. 2, 2006.

This application is related to co-pending U.S. patent application Ser. No. 13/547,334 filed Jul. 12, 2012.

This application is related to co-pending U.S. patent application Ser. No. 13/440,331 filed Apr. 5, 2012.

This application is related to co-pending U.S. patent application Ser. No. 13/401,181 filed Feb. 21, 2012.

This application is related to co-pending U.S. patent application Ser. No. 12/844,673 filed Jul. 27, 2010.

This application is related to co-pending U.S. patent application Ser. No. 12/813,408 filed Jun. 10, 2010.

This application is related to U.S. patent application Ser. No. 12/775,946 filed May 7, 2010, now U.S. Pat. No. 8,187,907.

This application is related to co-pending U.S. patent application Ser. No. 12/716,814, filed Mar. 3, 2010.

This application is related to co-pending U.S. patent application Ser. No. 12/708,361, filed Feb. 18, 2010.

This application is related to U.S. patent application Ser. No. 12/637,241, filed Dec. 14, 2009.

This application is related to co-pending U.S. patent application Ser. No. 12/544,001, filed Aug. 19, 2009.

This application is related to U.S. patent application Ser. Nos. 12/401,137, 12/401,157, and 12/401,189, filed Mar. 10, 2009.

This application is related to U.S. patent application Ser. No. 12/362,201, now U.S. Pat. No. 7,960,201; Ser. No. 12/362,213; and Ser. No. 12/362,225, filed Jan. 29, 2009.

This application is related to U.S. patent application Ser. No. 12/337,014 filed Dec. 17, 2008, now U.S. Pat. No. 7,785,989.

This application is related to U.S. patent application Ser. No. 12/271,127 and Ser. No. 12/271,192 filed Nov. 14, 2008.

This application is related to U.S. patent application Ser. No. 12/267,812 filed Nov. 10, 2008, now U.S. Pat. No. 8,236,600.

This application is related to U.S. patent application Ser. No. 12/190,449, filed Aug. 12, 2008, now U.S. Pat. No. 7,741,146, and its divisional patent application Ser. No. 12/816,205, filed Jun. 15, 2010, now U.S. Pat. No. 8,039,291.

This application is related to U.S. patent application Ser. No. 12/187,477, filed Aug. 7, 2008, now U.S. Pat. No. 8,263,853.

This application is related to U.S. patent application Ser. No. 12/218,558 and U.S. patent application Ser. No. 12/218,582 filed Jul. 16, 2008.

This application is related to U.S. patent application Ser. No. 12/123,864 filed May 20, 2008.

This application is related to U.S. patent application Ser. No. 12/023,772, filed Jan. 31, 2008, and U.S. patent application Ser. No. 13/473,802, filed May 17, 2012, now U.S. Pat. No. 8,895,342.

This application is related to U.S. patent application Ser. No. 11/956,069, filed Dec. 13, 2007, and its divisional application Ser. No. 12/187,454 filed Aug. 7, 2008, now U.S. Pat. No. 7,727,795.

This application is also related to U.S. patent application Ser. Nos. 11/860,142 and 11/860,183 filed Sep. 24, 2007.

This application is also related to U.S. patent application Ser. No. 11/445,793 filed Jun. 2, 2006, now U.S. Pat. No. 8,536,445.

This application is also related to U.S. patent application Ser. No. 11/500,053 filed Aug. 7, 2006, and its divisional application Ser. No. 12/417,367 filed Apr. 2, 2009, now U.S. Pat. No. 8,513,518, and its continuation-in-part application Ser. No. 13/946,574 filed Jul. 19, 2013, now U.S. Pat. No. 8,686,282.

BACKGROUND OF THE INVENTION

1. Field of the Invention

The present invention relates to the field of semiconductor devices, and to fabrication processes and devices such as multijunction solar cells based on III-V semiconductor compounds including a metamorphic layer. Some embodiments of such devices are also known as inverted metamorphic multijunction solar cells.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500×), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, the power-to-weight ratio of a solar cell becomes increasingly more important, and there is increasing interest in lighter weight solar cell assemblies and panels having both high efficiency and low mass.

Typical III-V compound semiconductor solar cells are fabricated on a semiconductor wafer in vertical, multijunction structures. The individual solar cells or wafers are then disposed in horizontal arrays, with the individual solar cells connected together in an electrical series circuit. The shape and structure of an array, as well as the number of cells it contains, are determined in part by the desired output voltage and current.

Inverted metamorphic solar cell structures based on III-V compound semiconductor layers, such as described in M. W. Wanlass et al., Lattice Mismatched Approaches for High Performance, III-V Photovoltaic Energy Converters (Conference Proceedings of the 31$^{st}$ IEEE Photovoltaic Specialists Conference, Jan. 3-7, 2005, IEEE Press, 2005), present an important conceptual starting point for the development of future commercial high efficiency solar cells. However, the materials and structures for a number of different layers of the cell proposed and described in such reference present a number of practical difficulties, particularly relating to the most appropriate choice of materials and fabrication steps.

In satellite and other space related applications in particular, the size, mass and cost of a solar cell assemblies and panels present different technical challenges for different sized payloads, space vehicle designs, ambient radiation requirements, and orbits or trajectories of the space vehicle.

SUMMARY OF THE INVENTION

Briefly, and in general terms, the present disclosure provides a method of manufacturing a solar cell comprising: providing a first substrate; depositing on the first substrate a sequence of layers of semiconductor material forming a solar cell, including a bottom metal contact layer; depositing a laminate structure having a thickness of 50 microns or less including a sequence of supporting layers separated by a bonding layer on top of the bottom metal contact layer; and removing the first substrate.

In some embodiments, the laminate structure has a weight of less than 11.0 mg per square centimeter.

In some embodiments, the laminate structure has a weight of about 10.8 mg per square centimeter.

In some embodiments, the laminate structure is composed of an alternating sequence of a metal layer and a bonding layer.

In some embodiments, wherein the laminate structure is composed of an alternating sequence of a carbon fiber layer and a bonding layer.

In some embodiments, the metal layer in the laminate structure is between 1.0 and 2.0 microns in thickness, and the bonding layer in the laminate structure is between 2.0 and 10.0 microns in thickness.

In some embodiments, the metal layer in the laminate structure is composed of titanium and the bonding layer is a polyimide, and the thickness of the bonding layer is at least twice that of the metal layer.

In some embodiments, the bottom metal layer is composed of a sequence of metal layers including titanium, gold and silver applied by an evaporative deposition or sputtering process.

In some embodiments, there further comprises depositing and lithographically patterning a plurality of metal grid lines disposed on the top surface of the first solar subcell, and attaching a cover glass supporting member over the metal grid lines including a ceria glass having a thickness of about 4 mils.

In some embodiments, the removal of the first substrate is done by a process including grinding or lapping to remove over 80% of its thickness, followed by an etching step to remove the remaining portion of the first substrate.

In some embodiments, the step of depositing a sequence of layers of semiconductor material includes forming a first solar subcell on said substrate having a first band gap; forming a second solar subcell over said first subcell having a second band gap smaller than said first band gap; forming a grading interlayer over said second subcell having a third band gap larger than said second band gap; forming a third solar subcell over said grading interlayer having a fourth band gap smaller than said second band gap such that said third subcell is lattice mismatched with respect to said second subcell, and the graded interlayer is compositionally graded to lattice match the second subcell on one side and the third subcell on the other side.

In some embodiments, the graded interlayer is composed of $(In_xGa_{1-x})_yAl_{1-y}As$, with $0<x<1$ and $0<y<1$, and selected such that the band gap of the interlayer material remains constant throughout its thickness.

In some embodiments, the band gap of the interlayer material remains constant at a predetermined value in the range of 1.6 eV±3% throughout its thickness.

In some embodiments, the first substrate is composed of GaAs.

In some embodiments, the solar cell is a two junction solar cell.

In some embodiments, the solar cell is a multijunction solar cell with three or more junctions.

In some embodiments, the first solar subcell is composed of an InGa(Al)P emitter region and an InGa(Al)P base region.

In some embodiments, the second solar subcell is composed of an InGaP emitter region and a GaAs base region.

In some embodiments, the third solar subcell is composed of InGaAs.

In some embodiments, the bonding layer is a polymide adhesive.

In some embodiments, the disclosure further comprises depositing a metal contact layer adjacent to said third solar subcell for making an electrical contact thereto; and forming a cut-out extending from a second peripheral edge of the solar cell opposite from said first edge and along the top surface of the solar cell to the metal contact layer to allow contact to be made to the metal contact layer.

In some embodiments, the disclosure further comprises bonding a discrete metal interconnection member to the metal contact layer through the cut-out.

In some embodiments, the discrete metal interconnection member is a planar rectangular clip having a first end-portion welded to the metal contact layer, a second portion connected to the first end-portion and extending through the cut-out and above the surface of the solar cell, and a third portion connected to the second portion and being serpentine in shape.

In some embodiments, the disclosure further comprises welding the third portion of the metal interconnection member to a terminal of opposite polarity of an adjacent solar cell to thereby form an electrical series connection.

In another aspect, the present disclosure provides a method of manufacturing a solar cell assembly comprising: providing a first substrate; depositing on the first substrate using an MOCVD process a sequence of layers of semiconductor material forming a solar cell, including forming a first solar subcell having a first band gap; forming a second solar subcell over said first subcell having a second band gap smaller than said first band gap; forming a grading interlayer over said second subcell having a third band gap larger than said second band gap and is compositionally graded to lattice match the middle subcell on one side and the bottom subcell on the other side, is composed of $(In_xGa_{1-x})_yAl_{1-y}As$ with $0<x<1$ and $0<y<1$, and selected such that the band gap of the interlayer material remains constant throughout its thickness; and forming a third solar subcell having a fourth band gap smaller than said second band gap such that said third subcell is lattice mismatched with respect to said second subcell; mounting a supporting member on top of the sequence of layers including a bottom metal contact layer and a laminate structure directly adjacent to the contact layer and having a thickness of 50 microns or less; removing the first substrate; depositing and lithographically patterning a plurality of metal grid lines disposed on the top surface of the first solar subcell, including at least one metal contact pad electrically connected to said grid lines and disposed adjacent to a first peripheral edge of said first solar subcell; providing a metal interconnection member with a first end portion; and bonding the metal interconnection member to the first terminal.

In some embodiments, there further comprises attaching a cover glass or glass supporting member over the grid lines after bonding the metal interconnection member.

In some embodiments, there further comprises attaching a plurality of interconnected solar cell assemblies to a flexible film by an adhesive to form an array of solar cells.

In some embodiments, there further comprises depositing a metal contact layer adjacent to said third solar subcell for making an electrical contact thereto; and forming a cut-out extending from a second peripheral edge of the solar cell opposite from said first edge and along the top surface of the solar cell to the metal contact layer.

In some embodiments, there further comprises bonding a discrete metal interconnection member to the metal contact layer through the cut-out, wherein the discrete metal interconnection member is a planar rectangular clip having a first end-portion welded to the metal contact layer, a second portion connected to the first end-portion and extending through the cut-out and above the surface of the solar cell, and a third portion connected to the second portion and being serpentine in shape, and welding the third portion of the metal interconnection member to a terminal of opposite polarity of an adjacent solar cell to thereby form an electrical series connection.

In another aspect, the present disclosure provides a multijunction solar cell comprising: a top first solar subcell having a first band gap; a middle second solar subcell disposed directly adjacent to said first subcell and having a second band gap smaller than said first band gap; a grading interlayer disposed directly adjacent to said second subcell and having a third band gap greater than second band gap; a bottom third solar subcell disposed and directly adjacent to said grading interlayer and being lattice mismatched with respect to said middle second subcell, and having a fourth band gap smaller than said second band gap; a first glass member disposed adjacent to said top first solar subcell; and a laminate structure having a thickness of 50 microns or less including an alternating sequence of at least ten metal layers and ten bonding layers disposed adjacent to said bottom third solar subcell.

In another aspect, the present disclosure provides a space vehicle comprising a payload disposed with the space vehicle; and a power source for the payload, including an array of solar cell assemblies mounted on a panel, each solar cell assembly including a top first solar subcell having a first band gap; a middle second solar subcell disposed directly adjacent to said first subcell and having a second band gap smaller than said first band gap; a grading interlayer disposed directly adjacent to said second subcell and having a third band gap greater than second band gap; a third solar subcell disposed and directly adjacent to said grading interlayer and being lattice mismatched with respect to said middle second subcell, and having a fourth band gap smaller than said second band gap; a glass member disposed adjacent to said top first solar subcell; and a laminate structure having a thickness of 50 microns or less including an alternating sequence of at least ten metal layers and ten bonding layers disposed adjacent to said bottom third solar subcell.

In some embodiments, the thickness of the laminate structure is in the range of 40 to 60 microns.

In some embodiments, the thickness of the laminate structure is in the range of 25 to 35 microns.

In some embodiments, the thickness of the laminate structure is in the range of 25 to 30 microns.

In some embodiments, the thickness of the laminate structure is in the range of 25 to 60 microns.

In some embodiments, the thickness of the laminate structure is in the range of X to Y microns, where $20<X<60$, and $20<Y<60$, and X and Y are optimally selected to meet the specific requirements or specifications of a particular application.

Some implementations of the present invention may incorporate or implement fewer of the aspects and features noted in the foregoing summaries.

Additional aspects, advantages, and novel features of the present invention will become apparent to those skilled in the art from this disclosure, including the following detailed description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

BRIEF DESCRIPTION OF THE DRAWINGS

The invention will be better and more fully appreciated by reference to the following detailed description when considered in conjunction with the accompanying drawings, wherein:

FIG. 3E is a cross-sectional view of a solar cell assembly of FIG. 3B after being mounted on a supporting panel, such view being through the 3E-3E plane indicated in FIG. 4;

DESCRIPTION OF THE PREFERRED EMBODIMENT

Figures 1A, 1B:
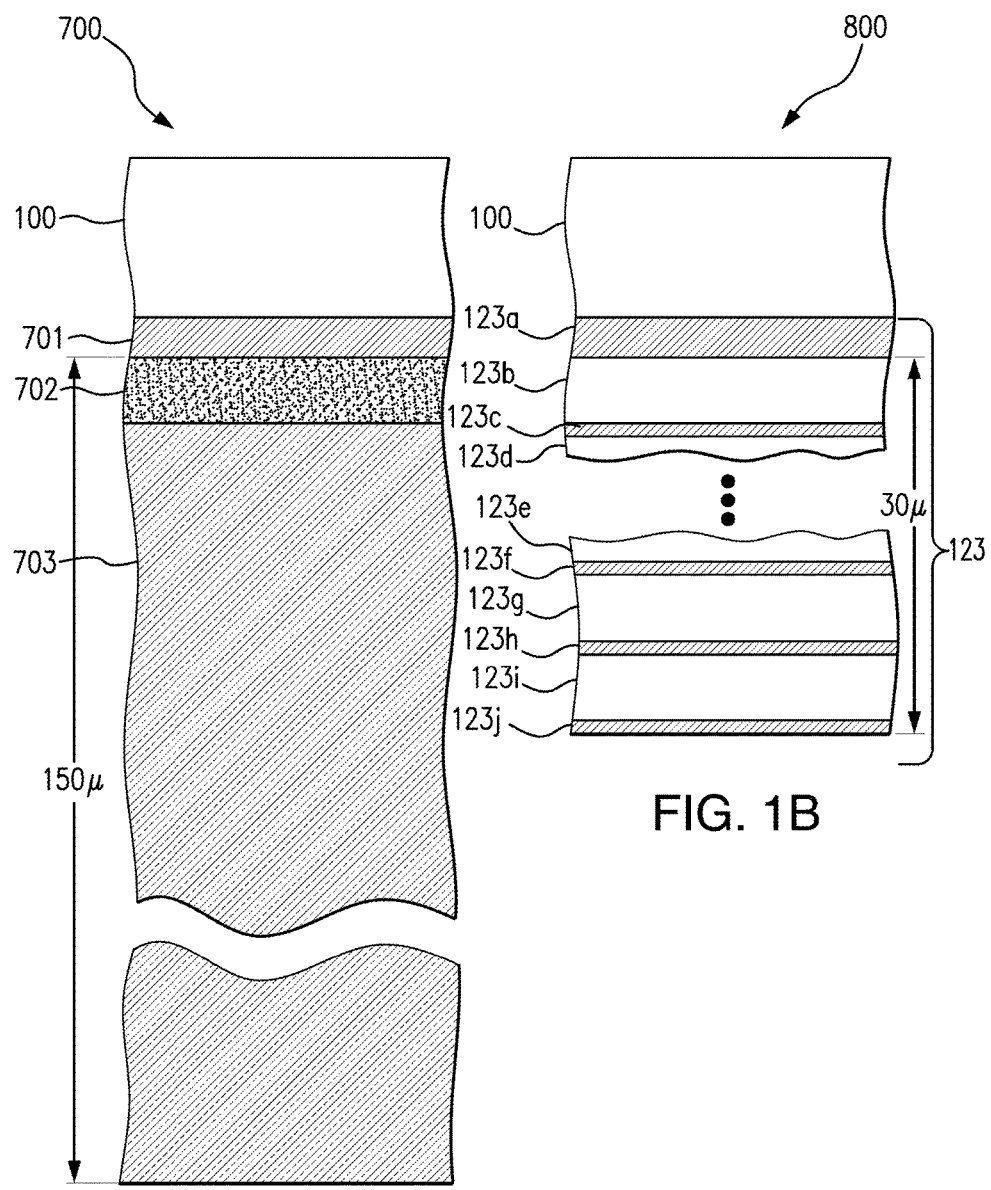
FIG. 1A is a cross-sectional view of a solar cell mounted on a supporting substrate prior to lithographic processing according to the prior art.
FIG. 1B is a cross-sectional view of a solar cell mounted on a supporting substrate prior to lithographic processing according to the present disclosure.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

A variety of different features of multijunction solar cells and inverted metamorphic multijunction solar cells are disclosed in the related applications noted above. Some, many or all of such features may be included in the structures and processes associated with the solar cells of the present disclosure. However, more particularly, the present disclosure is directed to the surrogate substrate or support utilized in the fabrication of a three-, four- or other multijunction solar cell grown on a single growth substrate. More generally, however, the present disclosure may be adapted to inverted metamorphic multijunction solar cells as disclosed in the related applications that may include three, four, five, six or more subcells, with band gaps in the range of 1.8 to 2.2 eV (or higher) for the top subcell, and 1.3 to 1.8 eV, 0.9 to 1.2 eV for the middle subcells, and 0.6 to 0.8 eV, for the bottom subcell, respectively.

The basic concept of fabricating an inverted metamorphic multijunction (IMM) solar cell is to grow the subcells of the solar cell on a substrate in a "reverse" sequence. That is, the high band gap subcells (i.e. subcells with band gaps in the range of 1.8 to 2.1 eV), which would normally be the "top" subcells facing the solar radiation, are initially grown epitaxially directly on a semiconductor growth substrate, such as for example GaAs or Ge, and such subcells are consequently lattice-matched to such substrate. One or more lower band gap middle subcells (i.e. with band gaps in the range of 1.2 to 1.8 eV) can then be grown on the high band gap subcells.

At least one lower subcell is formed over the middle subcell such that the at least one lower subcell is substantially lattice-mismatched with respect to the growth substrate and such that the at least one lower subcell has a third lower band gap (i.e., a band gap in the range of 0.7 to 1.2 eV). A back metal contact layer is then deposited. A surrogate substrate or support structure is then attached or provided over the "bottom" or substantially lattice-mismatched lower subcell, and the growth semiconductor substrate is subsequently removed.

A variety of different surrogate substrates or support structures for use in the fabrication of inverted metamorphic multijunction solar cells are disclosed in the related applications noted above. Since in many processes such structures remain attached to the solar cell after final assembly of a solar cell array and mounting on a panel, the weight of the support structure is of concern in satellite and other space related applications. As we noted above, the power-to-weight ratio of the solar cell assembly, including the support structure, is particularly important for such applications, and there is increasing interest in reducing the mass of such assemblies.

The design of a photovoltaic power system for a space vehicle presents a number of different design and parameter optimization issues that are quite different from that of terrestrial based systems. In addition to the power-to-weight ratio of the entire power system (i.e. the solar cell array including the support structure), other key parameters that must be considered and balanced against each other in a specific design task include the power-to-area ratio of the power system in both a stowed and a deployed configuration, the cost per watt of power measured at the beginning of life, at the end of life, and cumulatively during the entire system life. The design of a photovoltaic power system for a space vehicle that has a planned two year life for a mission to Mars in different from that a photovoltaic power system for a low orbit earth satellite.

Although the present disclosure provides a process for the design and fabrication of inverted metamorphic multijunction solar cells utilizing an improved surrogate substrate or support structure, and thereby substantially improving the overall power-to-weight ratio of the solar cell assembly which is important for space applications, such features may be included in the structures and processes associated with other types of solar cells and array structures for a variety of different photovoltaic power systems not expressly mentioned in this disclosure, such as for building integrated photovoltaic (BIPV) applications.

Moreover, the present disclosure provides a relatively simple and reproducible fabrication process for forming the support structure that is suitable for use in a high volume production environment in which various semiconductor layers are deposited in an MOCVD reactor. Subsequent processing steps are then defined to provide a support structure that minimizes any physical damage to the quality of the deposited layers during subsequent lithographic processing, thereby ensuring a relatively high yield of operable solar cells meeting specifications at the conclusion of the fabrication processes, and is suitable for remaining on the solar cell assembly and incorporated into the finished product when mounted on an array panel.

Prior to discussing the specific embodiments of the present disclosure, a brief discussion is in order of some of the more general issues associated with the design and fabrication of multijunction solar cells using an MOCVD process, and in particular with the design and fabrication of inverted metamorphic solar cells, and the context of the composition or deposition of various specific layers in embodiments of the solar cell assembly as specified and defined by Applicant.

There are a multitude of chemical, physical, mechanical and electrical properties that should be considered in specifying and selecting the composition of any specific semiconductor layer in a III-V compound semiconductor multijunction solar cells. In addition to the semiconductor layers, there are other layers in the structure such as the back metal layer, the adhesive or bonding material, and the supporting material for mounting a solar cell thereon that have similar considerations. For example, some of the properties that should be considered when selecting a particular layer or material are electrical properties (e.g. conductivity), optical properties (e.g., band gap, absorbance and reflectance), structural properties (e.g., thickness, strength, flexibility, Young's modulus, etc.), chemical properties (e.g., growth rates, the "sticking coefficient" or ability of one layer to adhere to another, stability of dopants and constituent materials with respect to adjacent layers and subsequent processes, etc.), thermal properties (e.g., thermal stability under temperature changes, coefficient of thermal expansion), and manufacturability (e.g., availability of materials, process complexity, process variability and tolerances, reproducibility of results over high volume, reliability and quality control issues).

These properties are especially important in the context of the fabrication of inverted metamorphic solar cells, since such structures present both challenging manufacturing considerations and also design issues associated with the lattice mismatching of various layers within the semiconductor structure. The lattice mismatching presents stresses between subcells that affect the electrical performance of the lattice mismatched subcells and present design considerations that are different from that of solar cells which are composed only of lattice matched solar cells.

Since there are trade-offs among the chemical, physical, mechanical and electrical properties that one might require, it is not always evident that the selection of a particular material, compound composition, or other design parameters based on a single one of the characteristic properties is always or typically "the best" or "optimum" from a commercial standpoint or for Applicant's purposes.

For example, theoretical studies may suggest the use of a quaternary material with a certain band gap for a particular subcell would be the optimum choice for that subcell layer based on fundamental semiconductor physics from the point of view of overall solar cell efficiency of the conversion of light energy into electrical energy. As an example, the teachings of academic papers and related proposals for the design of very high efficiency (over 40%) solar cells may therefore suggest that a solar cell designer specify the use of a quaternary material (e.g., InGaAsP) for the active layer of a subcell. A few such devices may actually be fabricated by other researchers, efficiency measurements made, and the results published as an example of the ability of such researchers to advance the progress of science by increasing the demonstrated efficiency of a compound semiconductor multijunction solar cell. Although such experiments and publications are of "academic" interest, from the practical perspective of the Applicants in designing a compound semiconductor multijunction solar cell to be produced in high volume at reasonable cost and subject to manufacturing tolerances and variability inherent in the production processes, such an "optimum" design from an academic perspective is not necessarily the most desirable design in practice, and maximizing the overall solar cell efficiency is not necessarily the paramount design goal of the Applicant. Thus, teachings of such studies more likely than not point in the wrong direction and lead away from the proper design direction. Stated another way, such references may actually "teach away" from Applicant's research efforts and the ultimate solar cell design proposed by the Applicant.

Applicant submits that any number of interactive variables can affect the overall performance and characteristics of a multijunction solar cell, solar cell assemblies, and solar cell arrays and platforms. Thus, if one wished to attempt increase the efficiency of a multijunction solar cell, or provide some other manufacturing advantage (such as simplicity- or ease-of-manufacturing, capability of high volume production with little lot-to-lot variation, increased manufacturing yield, reliability, etc.) or operational advantage (such as lighter weight, radiation hardness, compatibility with panel or support materials, mechanical robustness, etc.) there are almost an unlimited number of avenues that could be pursued with respect to the construction of the multijunction solar cell or its associated structures. In the context of the fabrication of inverted metamorphic solar cells, the challenging manufacturing considerations and also design issues we noted above further complicates the consideration of the number of avenues that could be pursued.

For example, consider one parameter, the efficiency of energy conversion, which measures how efficiently solar energy (or photons) is converted into electrical energy. Efficiency depends on various factors such as the design of solar cell structures, the number of subcells, the choice of semiconductor materials in each subcell, and the thickness of each subcell. In short, the energy conversion efficiency for each solar cell is dependent on the optimum utilization of the available sunlight across the solar spectrum as it is absorbed or passes through each semiconductor layer. As such, the characteristic of sunlight absorption in each layer of semiconductor material, also known as photovoltaic properties, is critical to determine the most efficient semiconductor material to achieve the optimum energy conversion.

Moreover, efficiency is not a static variable for many applications. In the space environment, where solar cells are exposed to radiation, the efficiency of the solar cell decreases over time. However, a solar cell is expected to be in operation for twenty years or more, so that the efficiency of a solar cell both at the beginning-of-life, and at the end-of-life, are both pertinent parameters. For such applications, maximizing the efficiency of the solar cell only at the beginning-of-life may not be optimal if in doing so the efficiency during the course of life, and at the end-of-life, is substantially less efficient than a solar cell with a different design but with a lower efficiency at the beginning-of-life.

Thus, the overall energy conversion efficiency of a multijunction solar cell is affected by such factors as the number of subcells, the thickness of each subcell, the doping in each subcell, the band structure, electron energy levels, conduction, and absorption of charge carriers in each subcell. Changes in these physical factors affect the electrical performance as measured by short circuit current density (Jsc), the open circuit voltage (Voc), and the fill factor. The control of these parameters during fabrication is the appropriate selection, out of a large number of materials and material compounds, of the most suitable material structures to achieve an appropriate combination of electrical parameters.

The semiconductor layers are not the whole story. To take an example in another layer, consider specifically the composition of the back metal layer in the solar cell. Some may argue that the prior art suggests the desirability of a "highly reflective" electrode for use as a back contact in an optoelectronic semiconductor device. One of ordinary skill in the art may than focus on the reflectivity properties of various metals, and conclude that from standard tables of reflectivity of metals that the choice of silver (Ag) would be a suitable choice for the back contact in the disclosed solar cell in order to maximize reflectivity and improve efficiency. On the other hand, an inverted metamorphic solar cell does not have the same or even similar structure as an optoelectronic semiconductor device, and the fabrication and process steps associated with producing an inverted structure present a number of challenges not encountered in the fabrication of other compound semiconductor devices on permanent and rigid substrates.

The problem presented by the choice of silver as a back metal is paradigmatic of the choice of any specific material based on certain preconceived notions of the critical parameters at issue in selecting a material constituent of any layer. There may be a finite number of metal elements in the periodic table, or column III or column V semiconductor materials, but there are not a small, finite number of identifiable predictable solutions to the potential problems arising in a complex manufacturing process for fabricating inverted metamorphic solar cells.

In view of the foregoing example, it is further evident that the identification of one particular constituent element (e.g. indium, or aluminum) in a particular subcell, or the thickness, band gap, doping, or other characteristic of the incorporation of that material in a particular subcell, is not a mere "design choice" or "result effective variable" that one skilled in the art can simply specify and incrementally adjust to a level and thereby increase the efficiency or electrical output of a solar cell or solar cell assembly. The efficiency of a solar cell is not a simple linear algebraic equation as a function of the amount of gallium or aluminum or other element or operational parameter in a particular layer. From a processing and fabrication perspective, the growth of each of the epitaxial layers of a solar cell in an MOCVD reactor is a non-equilibrium thermodynamic process with dynamically changing spatial and temporal boundary conditions that is not readily or predictably modeled. The formulation and exact solution of the relevant simultaneous partial differential equations covering such processes are not within the ambit of those of ordinary skill in the art in the field of solar cell design.

Even when it is known that particular variables have an impact on electrical, optical, chemical, thermal or other characteristics, the nature of the impact often cannot be predicted with much accuracy, particularly when the variables interact in complex ways, leading to unexpected results and unintended consequences. Thus, significant trial and error, which may include the fabrication of many test devices, often is required to determine whether a proposed structure with layers of particular compositions actually will operate and have the required electrical or optical characteristics as intended, let alone whether such structure can be integrated into a device that can be fabricated in a reproducible high volume manner within the manufacturing tolerances and variability inherent in the production process, and necessary for the design of a commercially viable component and assembly.

As in the case here, where multiple variables interact in unpredictable ways, the proper choice of the combination of materials, structures, processes, and variables can produce new and unexpected results, and constitute an "inventive step".

Returning to the discussion of the specific embodiments of the present disclosure, the lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), or other vapor deposition methods for the growth may enable the layers in the monolithic semiconductor structure forming the cell to be grown with the required thickness, elemental composition, dopant concentration and grading and conductivity type.

The present disclosure is directed to a growth process using a metal organic chemical vapor deposition (MOCVD) process in a standard, commercially available reactor suitable for high volume production. More particularly, the present disclosure is directed to the materials and fabrication steps that are particularly suitable for producing commercially viable multijunction solar cells or inverted metamorphic multijunction solar cells using commercially available equipment and established high-volume fabrication processes, as contrasted with merely academic expositions of laboratory or experimental results.

It should be noted that the layers of a certain target composition in a semiconductor structure grown in an MOCVD process are inherently physically different than the layers of an identical target composition grown by another process, e.g. Molecular Beam Epitaxy (MBE). The material quality (i.e., morphology, stoichiometry, number and location of lattice traps, impurities, and other lattice defects) of an epitaxial layer in a semiconductor structure is different depending upon the process used to grow the layer, as well as the process parameters associated with the growth. MOCVD is inherently a chemical reaction process, while MBE is a physical deposition process. The chemicals used in the MOCVD process are present in the MOCVD reactor and interact with the wafers in the reactor, and affect the composition, doping, and other physical, optical and electrical characteristics of the material. For example, the precursor gases used in an MOCVD reactor (e.g. hydrogen) are incorporated into the resulting processed wafer material, and have certain identifiable electro-optical consequences which are more advantageous in certain specific applications of the semiconductor structure, such as in photoelectric conversion in structures designed as solar cells. Such high order effects of processing technology do result in relatively minute but actually observable differences in the material quality grown or deposited according to one process technique compared to another. Thus, devices fabricated at least in part using an MOCVD reactor or using a MOCVD process have inherent different physical material characteristics, which may have an advantageous effect over the identical target material deposited using alternative processes.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be apparent to one skilled in the art that the inclusion of additional semiconductor layers within the cell with similar or additional functions and properties is also within the scope of the present disclosure.

FIG. 1A is a cross-sectional view of a solar cell 100 with a back metal layer 701 mounted on a supporting substrate 703 prior to lithographic processing according to the prior art forming a subassembly 700. The substrate 703 is typically glass and about 150 microns in thickness at the minimum. It is attached to the back metal layer 701 by an adhesive 702. Such a structure has the required robustness or mechanical strength to be able to the handled by high volume production equipment in subsequent lithographic processing.

FIG. 1B is a cross-sectional view of a similar solar cell 100 mounted on a laminate structure or supporting substrate 123 (comprising sublayers 123a, 123b, . . . 123j) which is formed or deposited prior to lithographic processing according to the present disclosure forming a subassembly 800. The laminate structure 123 according to the present disclosure includes metal sublayer 123a, which is the usual back metal on the back surface of the solar cell 100, and the additional layers 123b, 123c, . . . 123j which in some embodiments may be about 30 microns in thickness to achieve the required rigidity and performance during subsequent processing. Although an embodiment of ten layers (123a through 123j) are illustrated, other embodiments of any number of layers from six though sixteen are also within the scope of the present disclosure.

In some embodiments the laminate structure 123 according to the present disclosure may be less than 50 microns in thickness to achieve the required rigidity and performance, and in some embodiments the laminate structure 123 according to the present disclosure may be less than 40 microns in thickness. In some embodiments the laminate structure 123 according to the present disclosure and illustrated in FIG. 1B is 30 microns in thickness for layers 123b to the bottom layer.

More importantly the supporting substrate 703 of the prior art must be about 150 microns in thickness to have the required rigidity and performance during subsequent processing. Such a relatively thick and therefore massive supporting substrate has a mass of 2490 mg for a 65 square centimeter cell, or 1056 mg for a 27.56 square centimeter cell, or about 38 mg per square centimeter of cell area. (For completeness in discussion of still earlier supporting substrates, it is noted that the above mentioned substrate is still considerably thinner and lighter and therefore quite an improvement over that disclosed in U.S. Pat. No. 6,951,819 of Iles et al, in which the substrate illustrated in FIG. 10 therein, and described in column 16, lines 3-10 as being 100 microns in thickness, has a mass of 105 mg per square centimeter, based on a computation using the thickness of 100 microns).

On the other hand, the supporting substrate or laminate structure 123 (i.e. sublayers v123b through 123j) of the present disclosure about 30 microns in thickness has a mass of 425 mg for a 65 square centimeter cell, or 1800 mg for a 27.56 square centimeter cell, or about 0.0065 mg per square centimeter of cell area.

Since in many implementations the supporting substrate remains permanently affixed to the solar cell when assembled into an array and mounted on a panel in the finished product, the overall weight of the subassembly 700 or 800 is a critical factor for fabrication of an array for space applications, and the actual weights described in the preceding paragraph clearly favors the design of the supporting substrate or laminate structure set forth in the present disclosure for such applications. The reduction of weight from 3.8 mg per square centimeter to 0.0065 mg per square centimeter is clearly substantial.

In some embodiments of the present disclosure, the laminate 123 is composed of an alternating sequence of a metal layer (123a, 123c, etc.) and a bonding layer (123b, 123d, etc.). The first sublayer 123a is the "back metal" layer to which a terminal is contacted to make an electrical connection to the adjoining semiconductor contact layer of the solar cell, and is therefore somewhat thicker than the other metal sublayers. In some embodiments, the metal 123c, etc. in the laminate structure is between 1.0 and 2.0 microns in thickness, and the metal 123a in the laminate structure is about 3.2 microns in thickness.

In some embodiments, the bonding layer 123b, 123d, etc. in the laminate structure is between 2.0 and 10.0 microns in thickness.

Alternatively, in some embodiments, the laminate structure 123 is composed of an alternating sequence of a carbon fiber layer and a bonding layer.

In some embodiments, the metal layer (123c, 123f, etc.) in the laminate structure is composed of titanium and the bonding layer is a polyimide, and the thickness of the bonding layer (123b, 123d, etc.) is at least twice that of the metal layer.

In some embodiments, the bottom metal layer 123a is composed of a sequence of metal layers including titanium, gold and silver applied by an evaporative deposition or sputtering process.

Figure 2A:
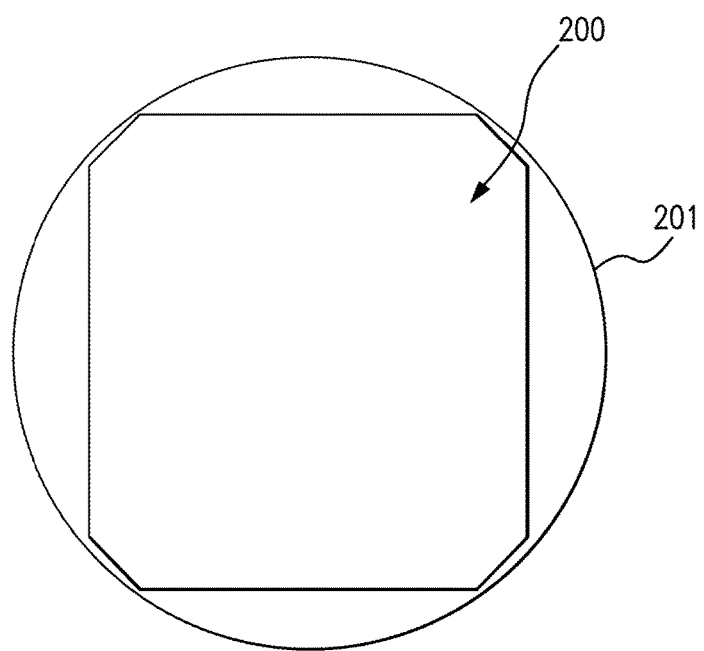
FIG. 2A is a top plan view of one of the solar cells of FIG. 1B showing it prior to be scribed from a wafer after processing.

FIG. 2A is a top plan view of the outline of a solar cell 200 prior to it be scribed or detached from a 100 mm (or 4 inch) wafer 201.

Figure 2B:
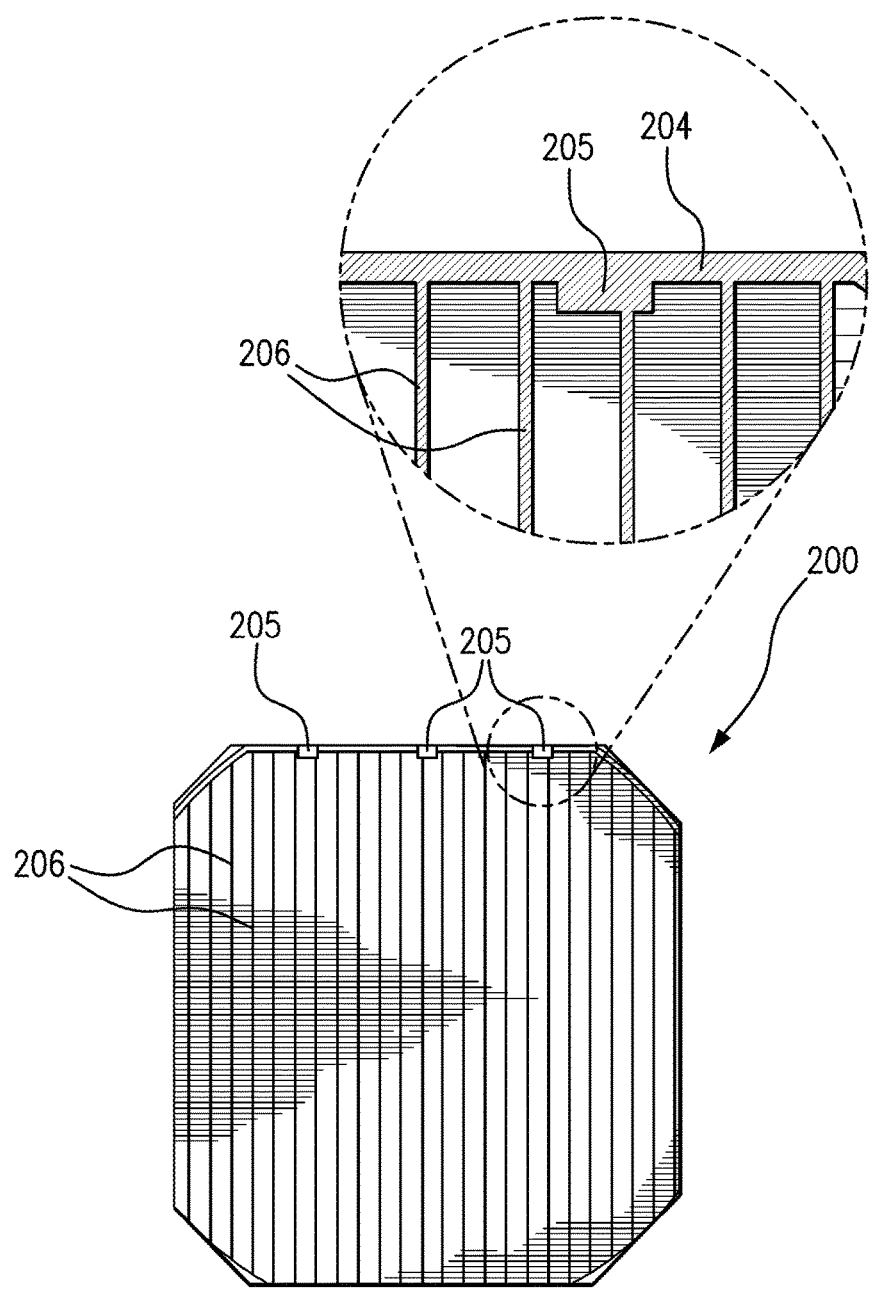
FIG. 2B is a more detailed top plan view of one of the scribed solar cell of FIG. 2A after processing showing in the enlargement the grid and bus lines and contact pads on the top surface.

FIG. 2B is a more detailed top plan view of the solar cell 200 of FIG. 2A configured in one embodiment as a "square" cell with cropped corners. The more detailed view of FIG. 2B represents the solar cell after lithographic processing and metal deposition, showing the grid lines 206 and bus lines 204 and contact pads 205 electrically connected to one another on the top surface of cell 200. Although only three contact pads 205 are shown in the embodiment of FIG. 2B, the position and number of pads that may be implemented can be varied, and be designed for the application and configuration of external contacts to the solar cell 200 that may be needed. The contact pads 205 form a terminal of first polarity of the solar cell 100.

Figure 2C:
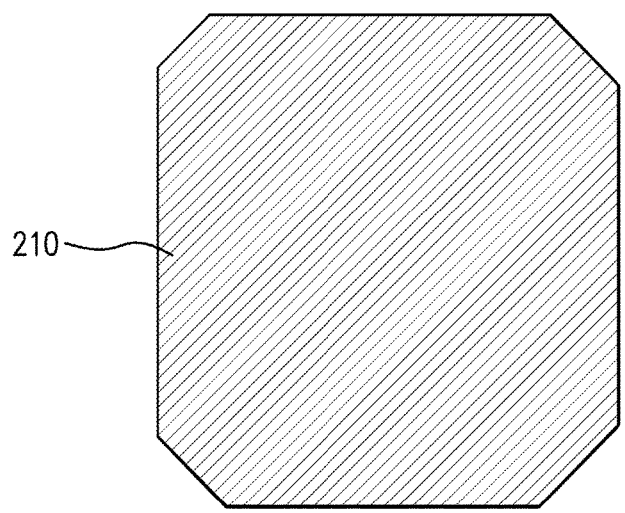
FIG. 2C is a bottom plan view of one of the solar cells of FIG. 1B showing the back metallization over the entire back surface of the solar cell.

FIG. 2C is a bottom plan view of the solar cell of FIG. 2A after processing showing a contact metal layer 210 extending over the entire bottom surface of cell. The contact metal layer 210 forms a terminal of second polarity of the solar cell 100.

Figure 3A:
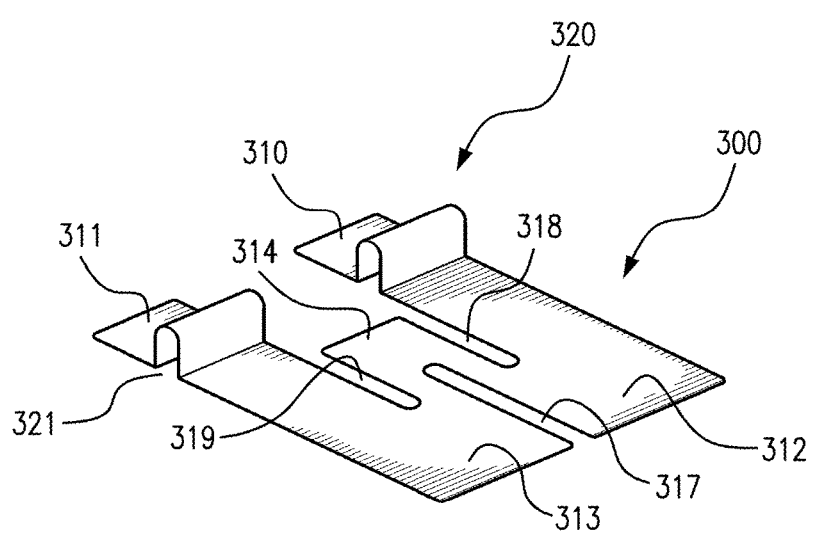
FIG. 3A is perspective view of an interconnect for use in interconnecting two adjacent solar cells to form a string of solar cells.

FIG. 3A is perspective view of a metal interconnection member or interconnect 300 for use in a string of solar cells according to some implementations, sometimes referred to as a "Z Interconnect". The interconnect 300 can include, for example, first and second flat contact members 310, 311 that extend outward for contact, respectively, with two of the top surface contacts (315 in FIG. 3D) on one of the solar cells. Thus, the flat contact members 310, 311 should be spaced from one another at a distance that is the same as the distance between adjacent top surface contacts (e.g., contact pads 205 of the cells 200 in FIG. 4). An advantage of providing at least two separate contact members and at least two respective top surface contacts is to achieve improved reliability in the event one of the electrical contacts is broken or otherwise shorts.

The interconnect 300 of FIG. 3A is serpentine shaped, with relatively large middle portions 312, 313 adapted for making electrical contact with the metal layer on the bottom surface (315 in FIG. 3F) of one of the solar cells. The interconnect 600 can include one or more gaps 317, 318, and 319 where the planar surface changes direction, for stress relief. The details of the interconnect 300 may differ in other implementations.

The first end portions 310 and 311 of the interconnect are typically welded to the spaced apart contacts 205 on the top surface of the solar cell, although other bonding techniques may be used as well. The electrical interconnect 300 further includes a U-shaped second portion 320, 321 connected to the respective first end portions 310, 311 a third planar portions 312, 313 connected to the second portions 320, 321. The third planar portions 312, 313 are connected by a relatively smaller intermediate fourth planar portion 314. The third planar portions 312, 313 form contact portions adapted for directly connecting to the bottom contact or terminal of first polarity of an adjacent second solar cell.

The interconnection member 300 may be composed of molybdenum, a nickel-cobalt ferrous alloy material such as Kovar™, or a nickel iron material such as Invar™ and may be substantially rectangular in shape, with a thickness of between 0.0007 and 0.0013 inches.

Figure 3B:
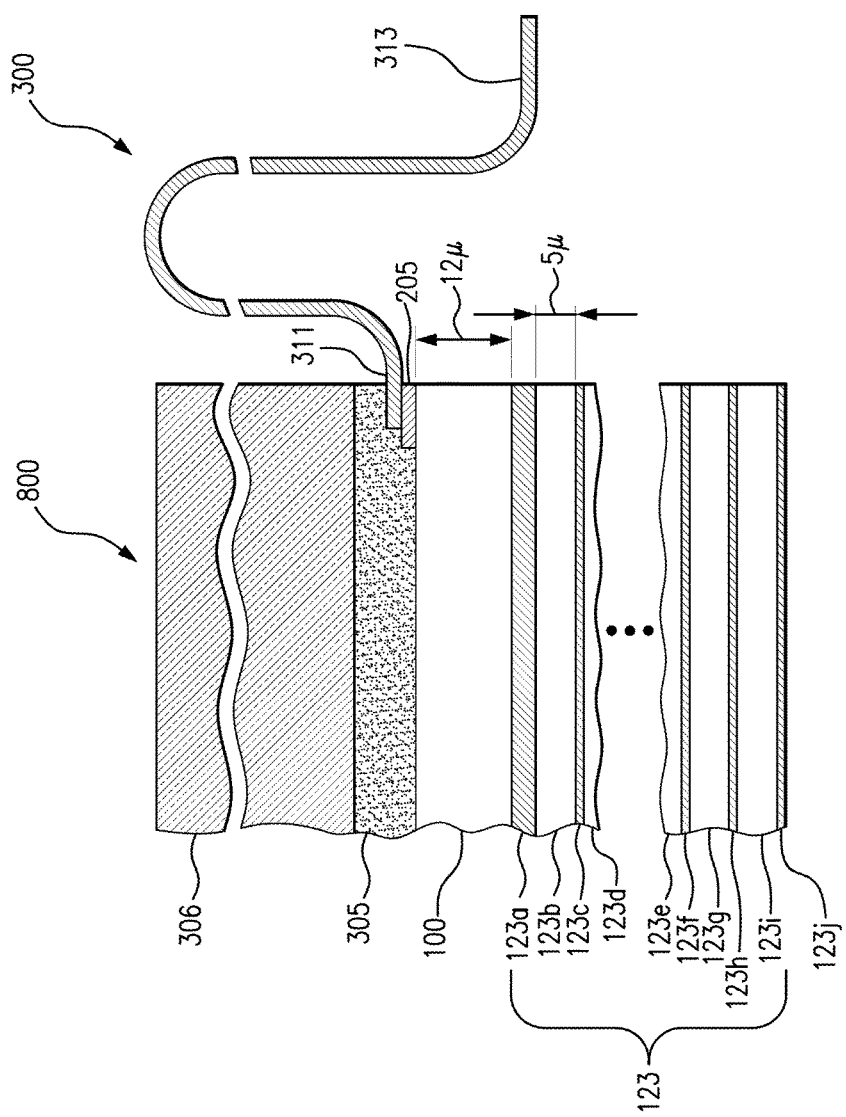
FIG. 3B is a cross-sectional view of a solar cell assembly including a solar cell mounted on a supporting substrate of FIG. 1B according to the present disclosure after lithographic processing and attachment of an interconnect such as shown in FIG. 3A, and a cover glass.

FIG. 3B is a cross-sectional view of a solar cell assembly 801 including a solar cell 100 mounted on a laminate structure 123 of FIG. 1B according to the present disclosure, after lithographic processing and attachment of an interconnect 300, such as shown in FIG. 3A, and a cover glass 306. (This solar cell assembly 801 is sometimes referred to as a "CIC" or a "coverglass-interconnect-cell" assembly).

The cover glass 306 is transparent when exposed to an AM0 space radiation environment (the spectrum found in orbit outside of the earth's atmosphere). In some embodiments, the cover glass 306 is typically a ceria doped borosilicate glass nominally 100 microns in thickness. The cover glass 306 is attached to the cell 100 by a suitable transparent silicone adhesive layer 305, nominally 50 microns in thickness. Although the use of a cover glass is desirable in some embodiments for many environmental conditions and applications, it is not necessary for all implementations, and additional layers or structures may also be utilized for providing additional support or environmental protection to the solar cell.

Figure 3C:
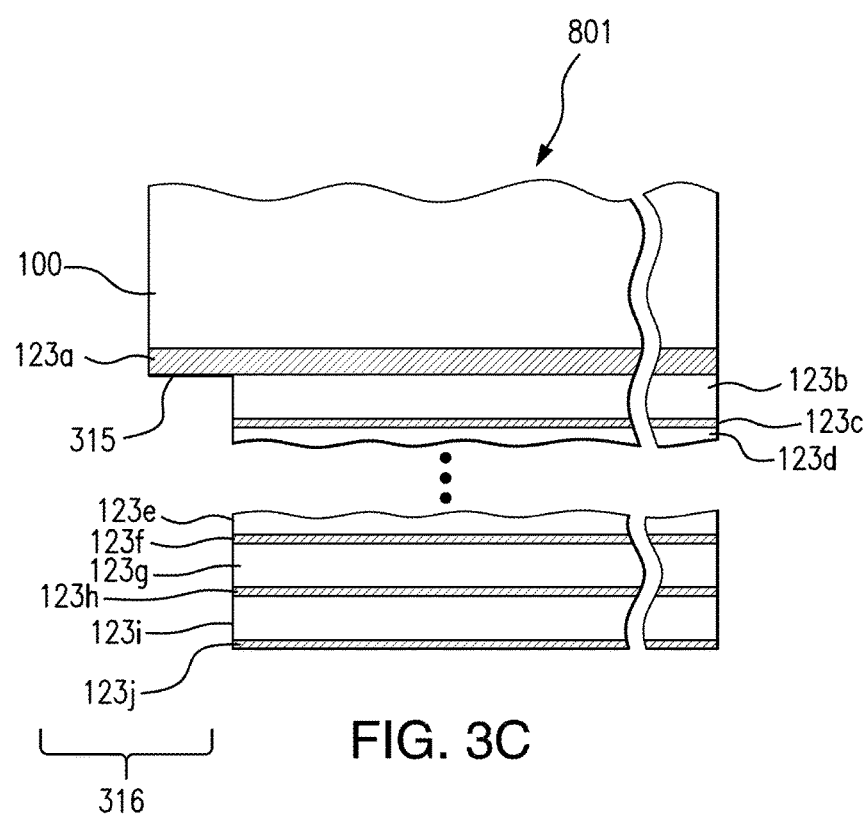
FIG. 3C is a cross-sectional view of the left hand portion of the solar cell mounted on a supporting substrate depicted in FIG. 3B as shown through the 3C-3C plane indicated in FIG. 3D.
Figure 3D:
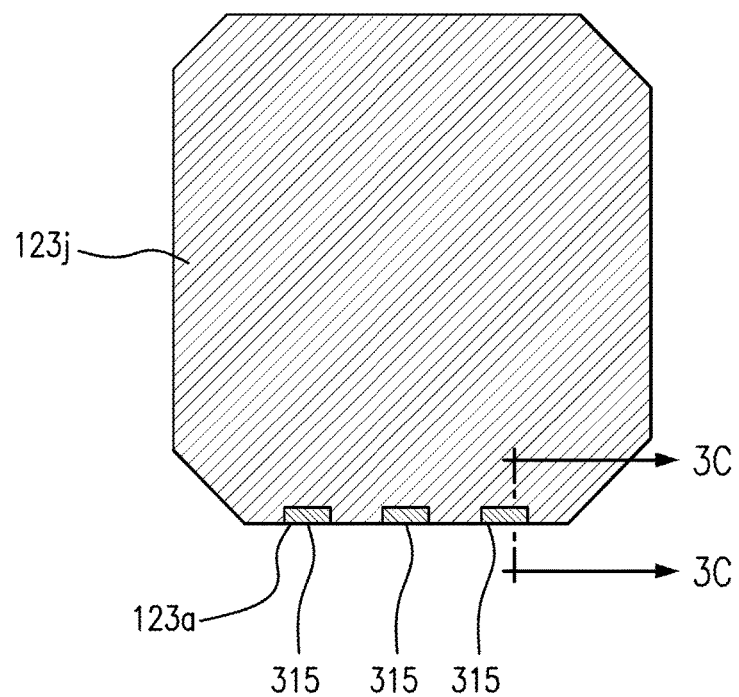
FIG. 3D is a bottom plan view of one of the solar cells of FIG. 3B showing the back metallization over the entire back surface of the laminate and contact pads along one edge of the solar cell to the back metal of the solar cell.

FIG. 3C is a cross-sectional view of the left hand portion of the solar cell assembly 801 depicted in FIG. 3B as shown through the 3C-3C plane indicated in FIG. 3D. In particular, there is depicted a cut-out 316 in which a portion of the laminate structure 123 is masked out prior to deposition of the laminate structure 123, leaving exposed only a pad 315 of the back metal layer 123a thereby forming a contact terminal of second polarity of the solar cell 100.

FIG. 3D is a bottom plan view of one of the solar cell assembly of FIG. 3B showing the metallization 123j over the entire back surface of the laminate structure 123 and three contact pads 315 spaced apart along one edge of the solar cell making contact to the back metal 123a of the solar cell 100 and therefore forming a terminal of second polarity of the solar cell 100.

Figure 4:
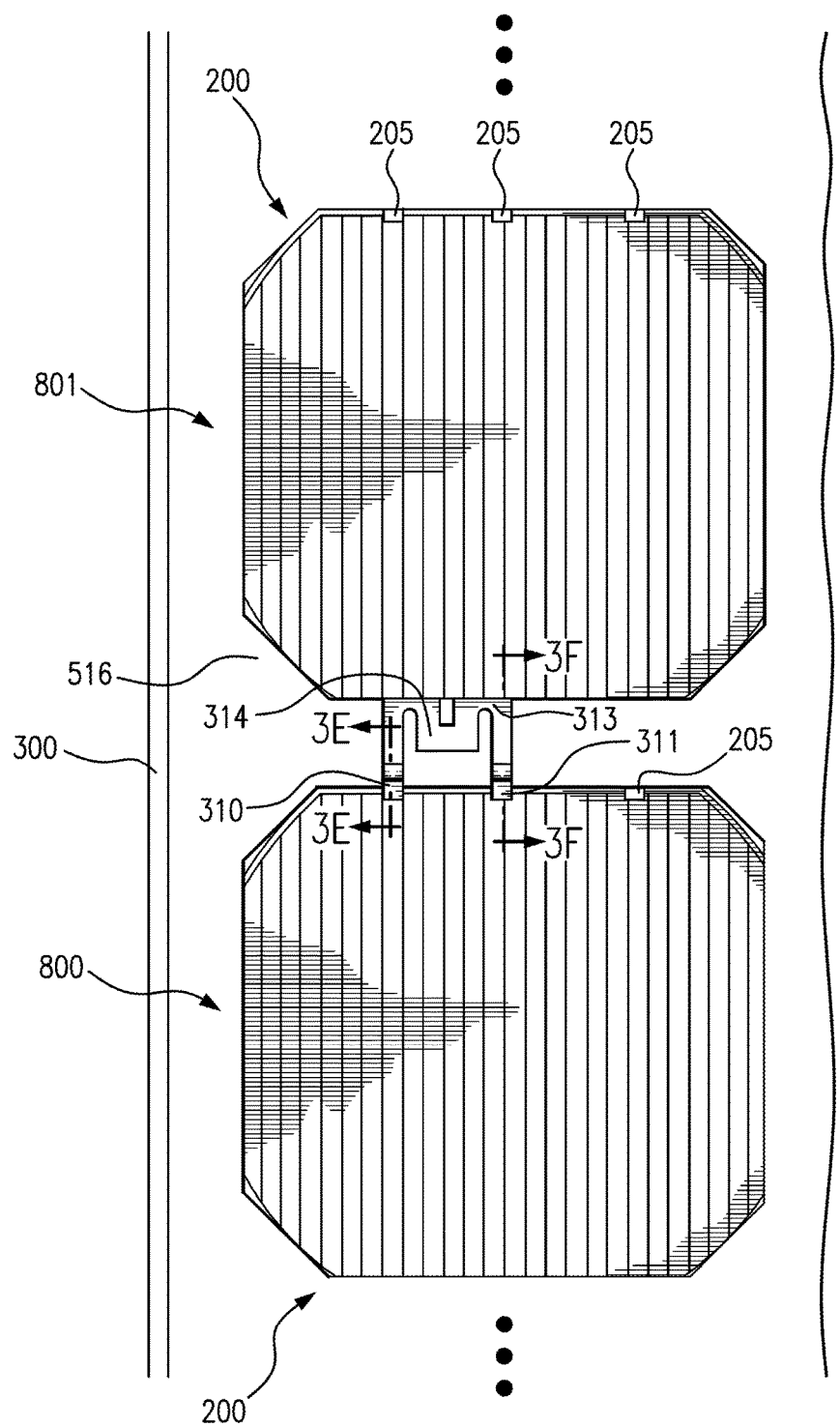
FIG. 4 is a top plan view of two adjacent solar cell assemblies of FIG. 3F with the interconnect such as shown in FIG. 3A being attached to each of the solar cells.

FIG. 3E is a cross-sectional view of a solar cell assembly 801 of FIG. 3B after being mounted on a supporting panel 516, such view being through the 3E-3E plane indicated in FIG. 4.

Figure 3F:
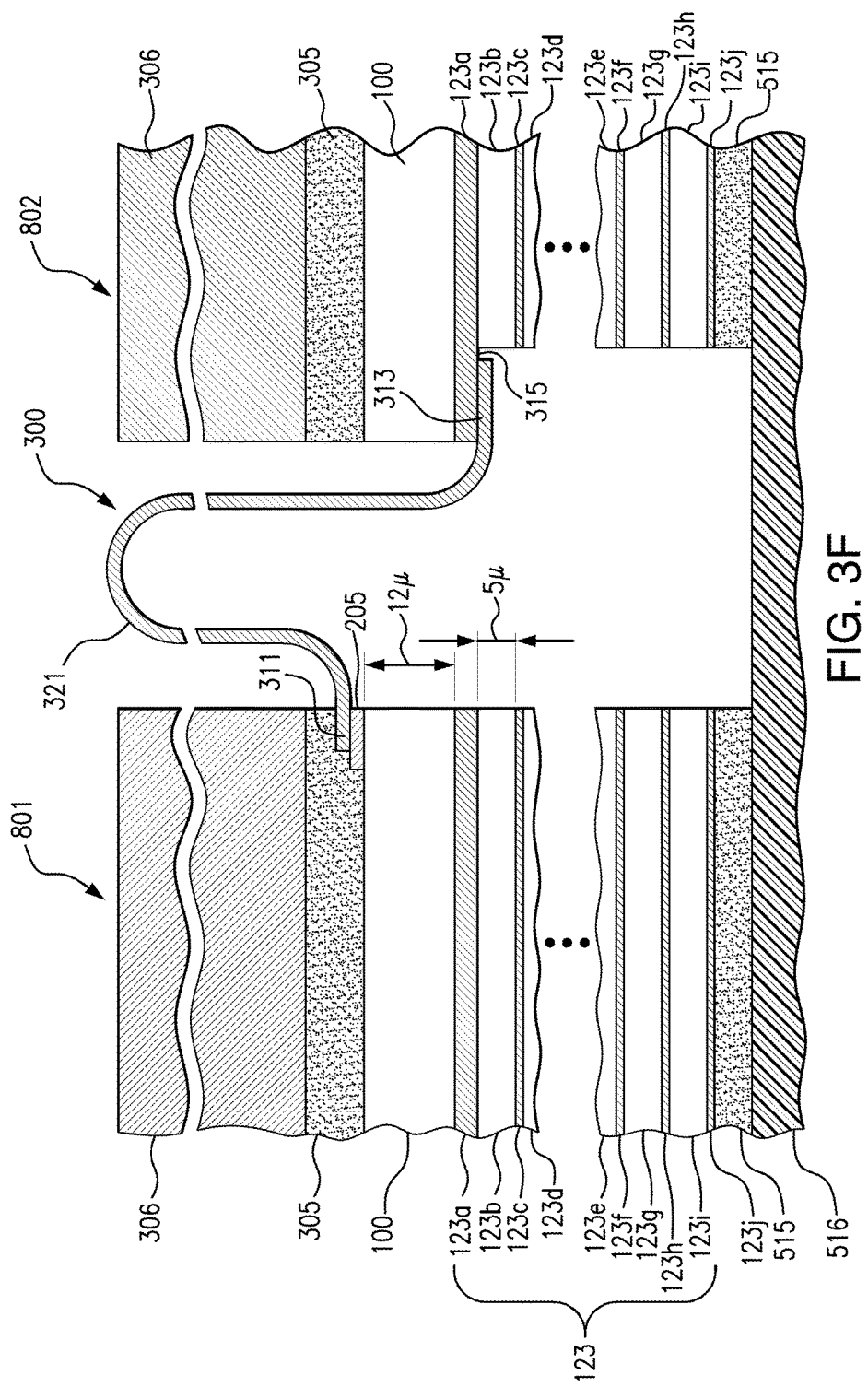
FIG. 3F is a cross-sectional view of a solar cell assembly of FIG. 3E mounted on a supporting panel with another solar cell assembly also adjacently mounted on the supporting panel through the 3F-3F plane indicated in FIG. 4, with the interconnect making a series electrical connection between the first solar cell assembly and the adjacent solar cell assembly.

FIG. 3F is a cross-sectional view of a solar cell assembly 801 of FIG. 3E mounted on a substrate or supporting panel 516 coupled to another solar cell assembly 802 which is adjacently mounted on the supporting panel 516. The cross-sectional view is through the 3F-3F plane indicated in FIG. 4, with the interconnect 300 making a series electrical connection between the first solar cell assembly 801 and the adjacent solar cell assembly 802.

In particular, FIG. 3F depicts the supporting panel or substrate 516 for supporting the solar cell assemblies 801, 802, etc. forming the array of a plurality of cells. The substrate or supporting panel 516 may be composed of polyimide or other flexible material. In some embodiments, a metallic layer or foil (not shown) is disposed on the backside of the substrate or supporting panel 516. The solar cell assemblies 801, 802, etc. are attached to the lower support or substrate or supporting panel 516 by an adhesive or bonding layer 515.

FIG. 4 is a top plan view of two adjacent solar cell assemblies 801 and 802 of FIG. 3F with the interconnect 300 such as shown in FIG. 3A being attached to electrical terminals or pads 205 on the top surface of solar cell assembly 801, and to the contact pad 315 on the back surface of solar cell assembly 802, thereby making an electrical connection between the two solar cell assemblies.

An adhesive layer 515 secures the cell 501 to the substrate 516, and similarly adhesive layer 515 secures the cell 521 to the substrate 516.

For completeness of this disclosure, the details of the fabrication of the semiconductor layers of the solar cell 100, and embodied in an inverted metamorphic solar cell, will now be described, essentially as set forth in any number of the related applications noted above.

Figure 5:
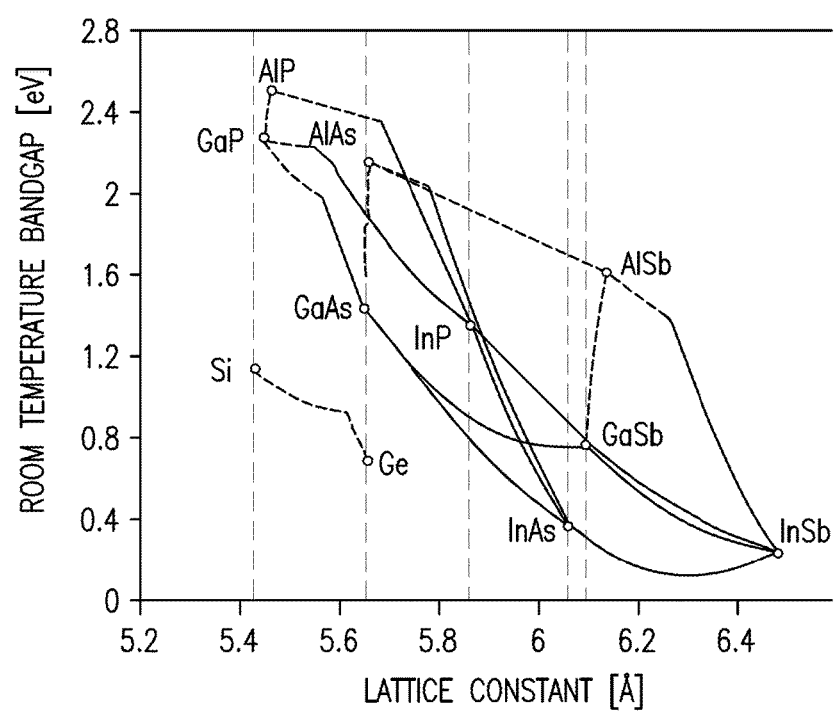
FIG. 5 is a graph representing the band gap of certain binary materials and their lattice constants.

FIG. 5 is a graph representing the band gap of certain binary materials and their lattice constants. The band gap and lattice constants of ternary materials are located on the lines drawn between typical associated binary materials (such as the ternary material GaAlAs being located between the GaAs and AlAs points on the graph, with the band gap of the ternary material lying between 1.42 eV for GaAs and 2.16 eV for AlAs depending upon the relative amount of the individual constituents). Thus, depending upon the desired band gap, the material constituents of ternary materials can be appropriately selected for growth.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), Molecular Beam Epitaxy (MBE), or other vapor deposition methods for the reverse growth may enable the layers in the monolithic semiconductor structure forming the cell to be grown with the required thickness, elemental composition, dopant concentration and grading and conductivity type.

Figure 6:
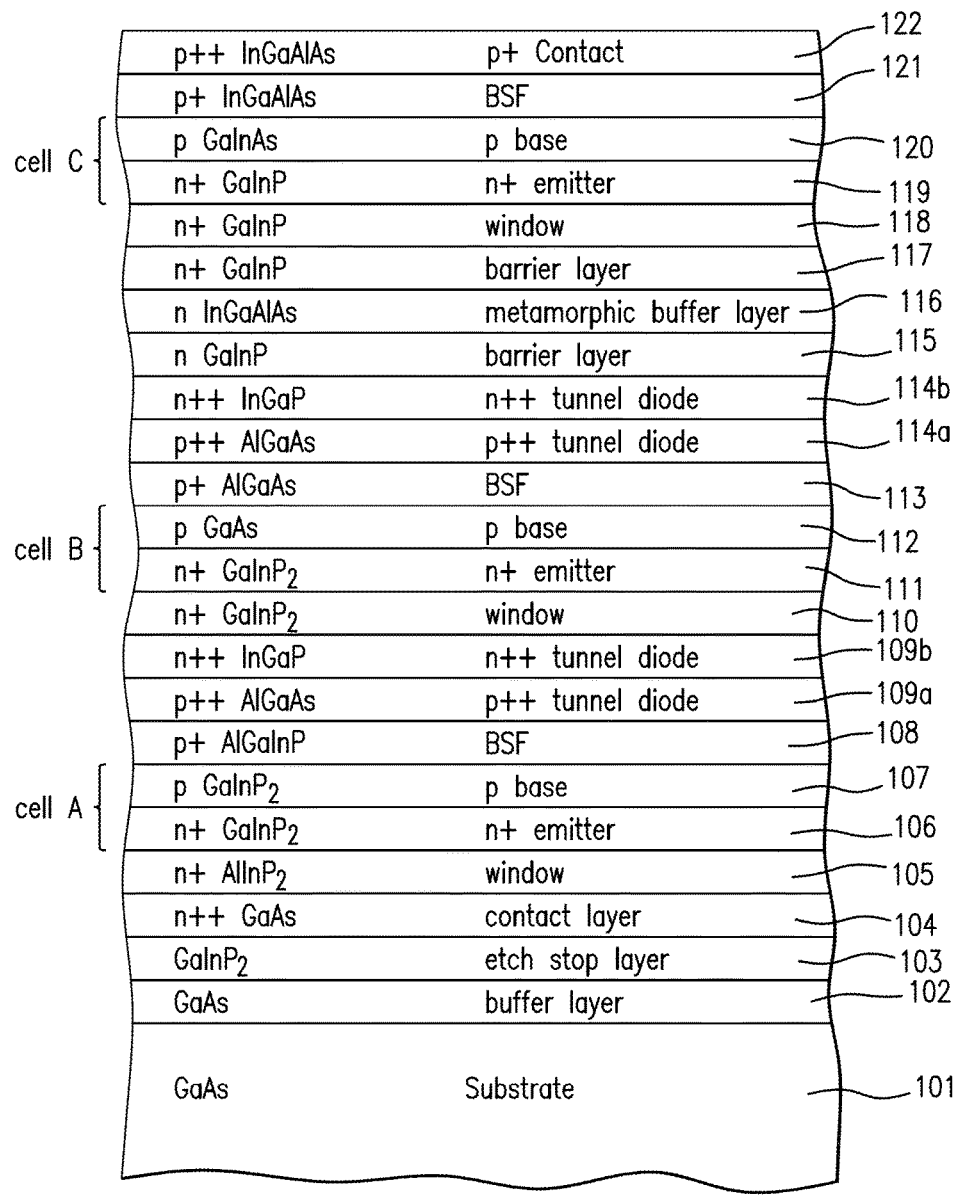
FIG. 6 is a cross-sectional view of a solar cell after the deposition of semiconductor layers on the growth substrate.

FIG. 6 depicts the multijunction solar cell according to the present disclosure after the sequential formation of the three subcells A, B and C on a GaAs growth substrate. More particularly, there is shown a substrate 101, which is preferably gallium arsenide (GaAs), but may also be germanium (Ge) or other suitable material. For GaAs, the substrate is preferably a 15° off-cut substrate, that is to say, its surface is orientated 15° off the (100) plane towards the (111)A plane, as more fully described in U.S. patent application Ser. No. 12/047,944, filed Mar. 13, 2008. Other alternative growth substrates, such as described in U.S. patent application Ser. No. 12/337,014 filed Dec. 17, 2008, may be used as well.

In the case of a Ge substrate, a nucleation layer (not shown) is deposited directly on the substrate 101. On the substrate, or over the nucleation layer (in the case of a Ge substrate), a buffer layer 102 and an etch stop layer 103 are further deposited. In the case of GaAs substrate, the buffer layer 102 is preferably GaAs. In the case of Ge substrate, the buffer layer 102 is preferably InGaAs. A contact layer 104 of GaAs is then deposited on layer 103, and a window layer 105 of AlInP is deposited on the contact layer. The subcell A, consisting of an n+ emitter layer 106 and a p-type base layer 107, is then epitaxially deposited on the window layer 105. The subcell A is generally latticed matched to the growth substrate 101.

It should be noted that the multijunction solar cell structure could be formed by any suitable combination of group III to V elements listed in the periodic table subject to lattice constant and bandgap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorus (P), arsenic (As), antimony (Sb), and bismuth (Bi).

In one embodiment, the emitter layer 106 is composed of InGa(Al)P and the base layer 107 is composed of InGa(Al)P. The aluminum or Al term in parenthesis in the preceding formula means that Al is an optional constituent, and in this instance may be used in an amount ranging from 0% to 30%.

Subcell A will ultimately become the "top" subcell of the inverted metamorphic structure after completion of the process steps according to the present invention to be described hereinafter.

On top of the base layer 107 a back surface field ("BSF") layer 108, in some embodiments composed of p+ AlGaInP, is deposited and used to reduce recombination loss.

The BSF layer 108 drives minority carriers from the region near the base/BSF interface surface to minimize the effect of recombination loss. In other words, a BSF layer 18 reduces recombination loss at the backside of the solar subcell A and thereby reduces the recombination in the base.

On top of the BSF layer 108 is deposited a sequence of heavily doped p-type and n-type layers 109a and 109b that forms a tunnel diode, i.e. an ohmic circuit element that connects subcell A to subcell B. Layer 109a is in some embodiments composed of p++ AlGaAs, and layer 109b is in some embodiments composed of n++ InGaP.

On top of the tunnel diode layers 109 a window layer 110 is deposited, in some embodiments n+ InGaP. The advantage of utilizing InGaP as the material constituent of the window layer 110 is that it has an index of refraction that closely matches the adjacent emitter layer 111, as more fully described in U.S. patent application Ser. No. 12/258,190, filed Oct. 24, 2008. More generally, the window layer 110 used in the subcell B operates to reduce the interface recombination loss. It should be apparent to one skilled in the art, that additional layer(s) may be added or deleted in the cell structure without departing from the scope of the present disclosure.

On top of the window layer 110 the layers of subcell B are deposited: the n-type emitter layer 111 and the p-type base layer 112. These layers are in some embodiments composed of InGaP and $In_{0.015}GaAs$ respectively (for a Ge substrate or growth template), or InGaP and GaAs respectively (for a GaAs substrate), although any other suitable materials consistent with lattice constant and bandgap requirements may be used as well. Thus, subcell B may be composed of a GaAs, GaInP, GaInAs, GaAsSb, or GaInAsN emitter region and a GaAs, GaInAs, GaAsSb, or GaInAsN base region.

In previously disclosed implementations of an inverted metamorphic solar cell, the middle cell was a homostructure. In some embodiments of the present invention, similarly to the structure disclosed in U.S. patent application Ser. No. 12/023,772, and U.S. Pat. No. 8,895,342, the middle subcell becomes a heterostructure with an InGaP emitter and its window is converted from InAlP to InGaP. This modification eliminated the refractive index discontinuity at the window/emitter interface of the middle sub-cell. Moreover, the window layer 110 is in some embodiments doped three times that of the emitter 111 to move the Fermi level up closer to the conduction band and therefore create band bending at the window/emitter interface which results in constraining the minority carriers to the emitter layer.

In one of the embodiments of the present invention, the middle subcell emitter has a band gap equal to the top subcell emitter, and the bottom subcell emitter has a band gap greater than the band gap of the base of the middle subcell. Therefore, after fabrication of the solar cell, and implementation and operation, neither the emitters of middle subcell B nor the bottom subcell C will be exposed to absorbable radiation. Substantially all of the photons representing absorbable radiation will be absorbed in the bases of cells B and C, which have narrower band gaps than the respective emitters. In summary, the advantages of the embodiments using heterojunction subcells are: (i) the short wavelength response for both subcells are improved, and (ii) the bulk of the radiation is more effectively absorbed and collected in the narrower band gap base. The overall effect will be to increase the short circuit current $J_{sc}$.

On top of the cell B is deposited a BSF layer 113 which performs the same function as the BSF layer 109. The p++/n++ tunnel diode layers 114a and 114b respectively are deposited over the BSF layer 113, similar to the layers 109a and 109b, forming an ohmic circuit element to connect subcell B to subcell C. In some embodiments the layer 114a is composed of p++ AlGaAs, and layer 114b is composed of n++ InGaP.

In some embodiments, a threading dislocation inhibition (or "barrier") layer 115, composed of n-type InGa(Al)P, is deposited over the tunnel diode 114a/114b, to a thickness from 0.25 to 1.0 micron. Such threading dislocation inhibition layer is disposed directly adjacent to the subsequently deposited metamorphic layer. The threading dislocation inhibition layer is intended to prevent threading dislocations associated with the stresses introduced by the various lattice mismatched or grading layers within the metamorphic layer from propagating, either opposite to the direction of growth into the middle and top subcells A and B, or in the direction of growth into the bottom subcell C. The performance improvement and other advantages of including such a distinct threading dislocation inhibition layer are more particularly described in copending U.S. patent application Ser. No. 11/860,183, filed Sep. 24, 2007. For convenience in labeling the layer in the drawings of the present application, we utilize the shorthand "barrier layer" but it is to be understood as a threading dislocation inhibition layer.

In that connection, it should be emphasized here that although the term "barrier layer" has previously been used by Applicants in the earlier U.S. patent application Ser. No. 11/860,183, and by other researchers in the published literature for a variety of sundry layers in a solar cell not serving the same purpose as the identified layer in Applicant's solar cell, in the present application the identified threading dislocation inhibition layer has a particular meaning that would be readily apparent to the person of ordinary skill in the field in view of structure of an inverted metamorphic solar cell and the stresses introduced and propagated by the lattice mismatching of not only the adjacent subcells but also the sublayers within the graded metamorphic layer itself. By expressly identifying the layer as threading dislocation inhibition layer it is intended to avoid any ambiguity or unwarranted assumptions concerning the composition, function and/or effect of such layer. In particular, identifying such layer as a threading dislocation inhibition layer (or in shorthand as a distinct "barrier" layer) in this and previous applications, such nomenclature signifies that the threading dislocation inhibition layer has a different and distinct composition from the directly adjacent layers. Thus, the introduction of the threading dislocation inhibition layer or "barrier" layer into a solar cell is a distinctive feature of U.S. patent application Ser. No. 11/860,183, and of the present disclosure. By placing such a layer in the designated position in the illustrated embodiments, the threading dislocation inhibition layer will have a function and effect which results in a demonstrable improvement in the ultimate performance, reliability, manufacturability, or other mechanical and processing related characteristics of the solar cell into which it is implemented.

In utilizing the terminology "different and distinct composition" in the preceding paragraph, and throughout this disclosure, we mean, most generally, a layer with different constituent elements, or the same constituent elements in different proportions or mole fractions (which would result in different lattice constants for the two materials), or the same constituent elements with different dopants, dopant concentrations, or dopant profiles such that the operational characteristics of the different layers are distinct and different.

A metamorphic layer (or graded interlayer) 116 is deposited directly over the threading dislocation inhibition layer 115, in some embodiments using a surfactant. Layer 116 is referred to as a graded interlayer since in some embodiments it is preferably a compositionally step-graded series of InGaAlAs layers, preferably with monotonically changing lattice constant in each step, so as to achieve a gradual transition in lattice constant in the semiconductor structure from the lattice constant of subcell B to the lattice constant of subcell C while minimizing threading dislocations from occurring. In some embodiments, the band gap of layer 116 is constant throughout its thickness, at approximately 1.6 eV (i.e., 1.6 eV±3% or in the range of about 1.55 eV to 1.65 eV), or otherwise consistent with a value slightly greater than the base bandgap of the middle subcell B. In some embodiments, the graded interlayer may be composed of $(In_xGa_{1-x})_yAl_{1-y}As$, with $0<x<1$, $0<y<1$, and the values of x and y selected for each respective layer such that the band gap of the entire interlayer remains constant at approximately 1.6 eV (i.e., 1.6 eV±3% or in the range of about 1.55 eV to 1.65 eV), or other appropriate band gap over its thickness. In some embodiments, the graded interlayer has a band gap that remains constant at approximately 1.5 eV over the entire interlayer, or a portion thereof.

In the inverted metamorphic structure described in the Wanlass et al. paper cited above, the metamorphic layer consists of nine compositionally graded InGaP steps, with each step layer having a thickness of 0.25 micron. As a result, each layer of Wanlass et al. has a different band gap. In one of the preferred embodiments of the present disclosure, the layer 116 is composed of a plurality of layers of InGaAlAs, with monotonically changing lattice constant, each sublayer in the plurality of layers having the same band gap.

In some implementations, forming a particular one of the graded interlayers includes selecting an interlayer composed of InGaAlAs, and identifying a set of compositions of the formula $(In_xGa_{1-x})_yAl_{1-y}As$ defined by specific values of x and y, wherein $0<x<1$ and $0<y<1$, each composition having the same particular band gap (e.g., a particular value in the range 1.6 eV±3% eV for the first graded interlayer or a particular value in the range 1.1 eV±3% eV for the second graded interlayer). Forming a particular graded interlayer also can include identifying appropriate lattice constants for either side of the graded interlayer so that they match, respectively, the adjacent solar subcells. Forming a particular graded interlayer further can include identifying a subset of compositions of the formula $(In_xGa_{1-x})_yAl_{1-y}As$ having the particular band gap that are defined by specific values of x and y, wherein $0<x<1$ and $0<y<1$, wherein the subset of compositions have lattice constants ranging from the identified lattice constant that matches the solar subcell on one side of the graded interlayer to the identified lattice constant that matches the solar subcell on the opposing side of the graded interlayer.

In some instances, one or more of the steps can be performed by a computer program. For example, identifying a set of compositions of the formula $(In_xGa_{1-x})_yAl_{1-y}As$ defined by specific values of x and y, each composition having the same particular band gap (e.g., a particular value in the range 1.6 eV±3% eV), can include using a computer program. Likewise, identifying a subset of compositions of the formula $(In_xGa_{1-x})_yAl_{1-y}As$ having the particular band gap that are defined by specific values of x and y, wherein the subset of compositions have lattice constants ranging from the identified lattice constant that matches the solar subcell on one side of the graded interlayer to the identified lattice constant that matches the solar subcell on the opposing side of the graded interlayer, can include using a computer program.

The fabrication method can include precisely controlling and incrementally adjusting a mole fraction of each of In, Ga and Al to form a continuously graded interlayer as the first, second or other graded interlayer. Forming a particular one of the graded interlayers also can include providing a metal organic chemical vapor deposition (MOCVD) system configured to independently control the flow of source gases for gallium, indium, aluminum, and arsenic, and selecting a reaction time, a temperature and a flow rate for each source gas to form a continuously graded interlayer as the particular graded interlayer.

The advantage of utilizing a constant band gap material such as InGaAlAs over a phosphide based material is that arsenide-based semiconductor material is much easier to process in standard commercial MOCVD reactors, compared to phosphide materials, while the small amount of aluminum provides a band gap that assures radiation transparency of the metamorphic layers.

Although one of the embodiments of the present disclosure utilizes a plurality of layers of InGaAlAs for the metamorphic layer 116 for reasons of manufacturability and radiation transparency, other embodiments of the present invention may utilize different material systems to achieve a change in lattice constant from subcell B to subcell C. Thus, the system of Wanlass using compositionally graded InGaP is a second embodiment of the present invention. Other embodiments of the present invention may utilize continuously graded, as opposed to step graded, materials. More generally, the graded interlayer may be composed of any of the As, P, N, Sb based III-V compound semiconductors subject to the constraints of having the in-plane lattice parameter greater or equal to that of the second solar cell and less than or equal to that of the third solar cell, and having a band gap energy greater than that of the second solar cell.

Since the present disclosure (and the related applications noted above) are directed to high volume manufacturing processes using metalorganic vapor phase epitaxy (MOVPE) reactors to form the solar cell epitaxial layers, a short discussion of some of the considerations associated with such processes and methods associated with the formation of the graded interlayer(s) are in order here.

First, it should be noted that the advantage of utilizing an interlayer material such as AlGaInAs is that arsenide-based semiconductor material is much easier to process from a manufacturing standpoint using present state-of-the-art high volume manufacturing metalorganic vapor phase epitaxy (MOVPE) reactors than either the AlGaInAsP, or GaInP compounds, or in general any material including phosphorus. Simply stated, the use of a III-V arsenide compound is much more desirable than a III-V phosphide compound from the perspectives of cost, ease of growth, reactor maintenance, waste handling and personal safety.

The cost advantage of the use of the AlGaInAs quaternary grading material relative to a GaInP ternary grading material, as an example, is a consequence of several factors. First, the use of a GaInP grading approach requires indium mole fractions of the order of 60% (i.e., the required material is $Ga_{0.4}In_{0.6}P$) whereas the use of the AlGaInAs quaternary requires only 15% indium (i.e., the required material is $Al_y(Ga_{0.85}In_{0.15})_{1-y}As$). In addition to the difference in the material itself, there is a further difference in the amount of precursor gases (trimethylgallium, trimethylindium, and arsine) that must be input to the reactor in order to achieve the desired composition. In particular, the ratio of the amount of precursor gases into the reactor to provide Group V elements, to the amount of precursor gases to provide Group III elements (such ratio being referred to as the "input VIII ratio") is typically five to ten times greater to produce a phosphide compound compared to producing an arsenide compound. As a illustrative quantification of the cost of producing a phosphide compound in a commercial operational MOPVE reactor process compared to the cost of producing an arsenide compound, Table 1 below presents the typical pro-forma costs of each element of the AlGaInAs and GaInP compounds for producing a graded interlayer of the type described in the present disclosure expressed on a per mole basis. Of course, like many commodities, the price of chemical compounds fluctuate from time to time and vary in different geographic locations and countries and from supplier to supplier. The cost calculations make the assumption (typical for epitaxial processes using current commercial MOVPE reactors) that the input VIII ratios are 20 and 120 for the arsenide and phosphide compounds respectively. Such a choice of value of the ratio is merely illustrative for a typical process, and some processes may use even higher ratios for producing a graded interlayer of the type described in the present disclosure. The practical consequence of the inlet VIII ratio is that one will use 20 moles of As to one (1) mole of AlGaIn in the formation of the Applicant's quaternary material AlGaInAs, or 120 moles of P to 1 mole of GaIn in the formation of the interlayer using the ternary material GaInP. These assumptions along with the molar cost of each of the constituent elements indicate that the cost of fabrication of the AlGaInAs based grading interlayer will be approximately 25% of the cost of fabrication of a similar phosphide based grading interlayer. Thus, there is an important economic incentive from a commercial and manufacturing perspective to utilize an arsenide compound as opposed to a phosphide compound for the grading interlayer.

The "ease of growth" of an arsenide compound as opposed to a phosphide compound for the grading interlayer in a high volume manufacturing environment is another important consideration and is closely related to issues of reactor maintenance, waste handling and personal safety. More particularly, in a high volume manufacturing environment the abatement differences between arsenide and phosphide based processes affect both cost and safety. The abatement of phosphorus is more time consuming, and hazardous than that required for arsenic. Each of these compounds builds up over time in the downstream gas flow portions of the MOVPE growth reactor. As such, periodic reactor maintenance for removal of these deposited materials is necessary to prevent adverse affects on the reactor flow dynamics, and thus the repeatability and uniformity of the epitaxial structures grown in the reactor. The difference in handling of these waste materials is significant. Arsenic as a compound is stable in air, non-flammable, and only represents a mild irritant upon skin contact. Phosphorus however, must be handled with considerably more care. Phosphorus is very flammable and produces toxic fumes upon burning and it is only moderately stable in air. Essentially the differences are manifest by the need for special handling and containment materials and procedures when handling phosphorus to prevent either combustion or toxic exposure to this material whereas using common personal protection equipment such as gloves, and a particle respirator easily accommodates the handling of arsenic.

Another consideration related to "ease of growth" that should be noted in connection with the advantages of a AlGaInAs based grading interlayer process compared to a AlGaInAsP compound derives from a frequently encountered issue when using an AlGaInAsP compound: the miscibility gap. A miscibility gap will occur if the enthalpy of mixing exceeds the entropy of mixing of two binary compounds AC and BC, where A, B and C are different elements. It is an established fact that the enthalpies of mixing of all ternary crystalline alloys of the form $A_xB_{1-x}C$, based upon the binary semiconductor forms AC and BC are positive leading to miscibility gaps in these compounds. See, for example, the discussion in reference [1] noted below. In this example, the letters A and B designate group III elements and letter C designates a group V element. As such, mixing of the binary compounds is said to occur on the group III sublattice. However, because OMVPE growth takes place under non-equilibrium conditions, the miscibility gap is not really a practical problem for accessing the entire ternary III-V semiconductor phase space. For the case of quaternary compounds of the form $A_xB_{1-x}C_yD_{1-y}$ where mixing of the binary alloys, AC, AD, BC, and BD occurs on both the group III and group V sublattices, the immiscibility problem is accentuated. Specifically for the GaP, InP, GaAs, InAs system, the region of immiscibility is quite large at growth temperatures appropriate for the OMVPE technique. See, for example, the discussion in reference [2] noted below. The resulting miscibility gap will prevent one from producing the requisite AlGaInAsP compounds needed for optical transparent grading of the IMM solar cell.

REFERENCES

V. A. Elyukhin, E. L. Portnoi, E. A. Avrutin, and J. H. Marsh, J. Crystal Growth 173 (1997) pp 69-72.

G. B. Stringfellow, Organometallic Vapor-Phase Epitaxy (Academic Press, New York 1989).

The fabrication of a step graded (or continuous graded) interlayer in an MOCVD process can be more explicitly described in a sequence of conceptual and operational steps which we describe here for pedagogical clarity. First, the appropriate band gap for the interlayer must be selected. In one of the disclosed embodiments, the desired constant band gap is 1.6 eV (i.e., 1.6 eV±3% or in the range of about 1.55 eV to 1.65 eV), or other appropriate band gap over its thickness. Second, the most appropriate material system (i.e., the specific semiconductor elements to form a compound semiconductor alloy) must be identified. In the disclosed embodiment, these elements are Al, Ga, In, and As. Third, a computation must be made, for example using a computer program, to identify the class of compounds of $Al_y(Ga_x In_{1-x})_{1-y}As$ for specific x and y that have a band gap of 1.6 eV (i.e., 1.6 eV±3% or in the range of about 1.55 eV to 1.65 eV), or other appropriate band gap over its thickness. An example of such a computer program output that provides a very rough indication of these compounds is illustrated in FIG. 22. Fourth, based upon the lattice constants of the epitaxial layers adjoining the graded interlayer, a specification of the required lattice constants for the top surface of the interlayer (to match the adjacent semiconductor layer), and the bottom surface of the interlayer (to match the adjacent semiconductor layer) must be made. Fifth, based on the required lattice constants, the compounds of $Al_y(Ga_x In_{1-x})_{1-y}As$ for specific x and y that have a band gap of 1.6 eV (i.e., 1.6 eV±3% or in the range of about 1.55 eV to 1.65 eV), or other appropriate band gap over its thickness, may be identified. Again, a computation must be made, and as an example, the data may be displayed in a graph such as FIG. 18 representing the Al, Ga and In mole fractions versus the Al to In mole fraction in a AlGaInAs material system that is necessary to achieve a constant 1.6 eV (i.e., 1.6 eV±3% or in the range of about 1.55 eV to 1.65 eV), or other appropriate band gap over its thickness. Assuming there is a small number (e.g. typically in the range of seven, eight, nine, ten, etc.) of steps or grades between the top surface and the bottom surface, and that the lattice constant difference between each step is made equal, the bold markings in FIG. 18 represent selected lattice constants for each successive sublayer in the interlayer, and the corresponding mole fraction of Al, Ga and In needed to achieve that lattice constant in that respective sublayer may be readily obtained by reference to the axes of the graph. Thus, based on an analysis of the data in FIG. 18, the reactor may be programmed to introduce the appropriate quantities of precursor gases (as determined by flow rates at certain timed intervals) into the reactor so as to achieve a desired specific $Al_y(Ga_x In_{1-x})_{1-y}As$ composition in that sublayer so that each successive sublayer maintains the constant band gap of 1.6 eV (i.e., 1.6 eV±3% or in the range of about 1.55 eV to 1.65 eV), or other appropriate band gap over its thickness, and a monotonically increasing lattice constant. The execution of this sequence of steps, with calculated and determinate precursor gas composition, flow rate, temperature, and reactor time to achieve the growth of a $Al_y(Ga_x In_{1-x})_{1-y}As$ composition of the interlayer with the desired properties (lattice constant change over thickness, constant band gap over the entire thickness), in a repeatable, manufacturable process, is not to be minimalized or trivialized.

Although one embodiment of the present disclosure utilizes a plurality of layers of AlGaInAs for the metamorphic layer 116 for reasons of manufacturability and radiation transparency, other embodiments of the present disclosure may utilize different material systems to achieve a change in lattice constant from subcell C to subcell D. Other embodiments of the present disclosure may utilize continuously graded, as opposed to step graded, materials. More generally, the graded interlayer may be composed of any of the As, N, Sb based III-V compound semiconductors subject to the constraints of having the in-plane lattice parameter greater or equal to that of the third solar cell and less than or equal to that of the fourth solar cell, and having a band gap energy greater than that of the third solar cell.

In another embodiment of the present disclosure, an optional second threading dislocation inhibition layer 117 may be deposited over the InGaAlAs metamorphic layer 116. The second threading dislocation inhibition layer 117 will typically have a different composition than that of threading dislocation inhibition layer 115, and performs essentially the same function of preventing threading dislocations from propagating. In one embodiment, alpha layer 117 is n+ type GaInP.

A window layer 118 preferably composed of n+ type GaInP is then deposited over the threading dislocation inhibition layer 117 (or directly over layer 116, in the absence of a second threading dislocation inhibition layer). This window layer operates to reduce the recombination loss in subcell "C". It should be apparent to one skilled in the art that additional layers may be added or deleted in the cell structure without departing from the scope of the present invention.

On top of the window layer 118, the layers of cell C are deposited: the n+ emitter layer 119, and the p-type base layer 120. These layers are preferably composed of n+ type InGaAs and p type InGaAs respectively, or n+ type InGaP and p type InGaAs for a heterojunction subcell, although another suitable materials consistent with lattice constant and bandgap requirements may be used as well.

A BSF layer 121, preferably composed of InGaAlAs, is then deposited on top of the cell C, the BSF layer performing the same function as the BSF layers 108 and 113.

Finally a high band gap contact layer 122, preferably composed of InGaAlAs, is deposited on the BSF layer 121.

This contact layer added to the bottom (non-illuminated) side of a lower band gap photovoltaic cell, in a single or a multijunction photovoltaic cell, can be formulated to reduce absorption of the light that passes through the cell, so that (1) an ohmic metal contact layer below (non-illuminated side) it will also act as a mirror layer, and (2) the contact layer doesn't have to be selectively etched off, to prevent absorption.

It should be apparent to one skilled in the art, that additional layer(s) may be added or deleted in the cell structure without departing from the scope of the present invention.

Figure 7:
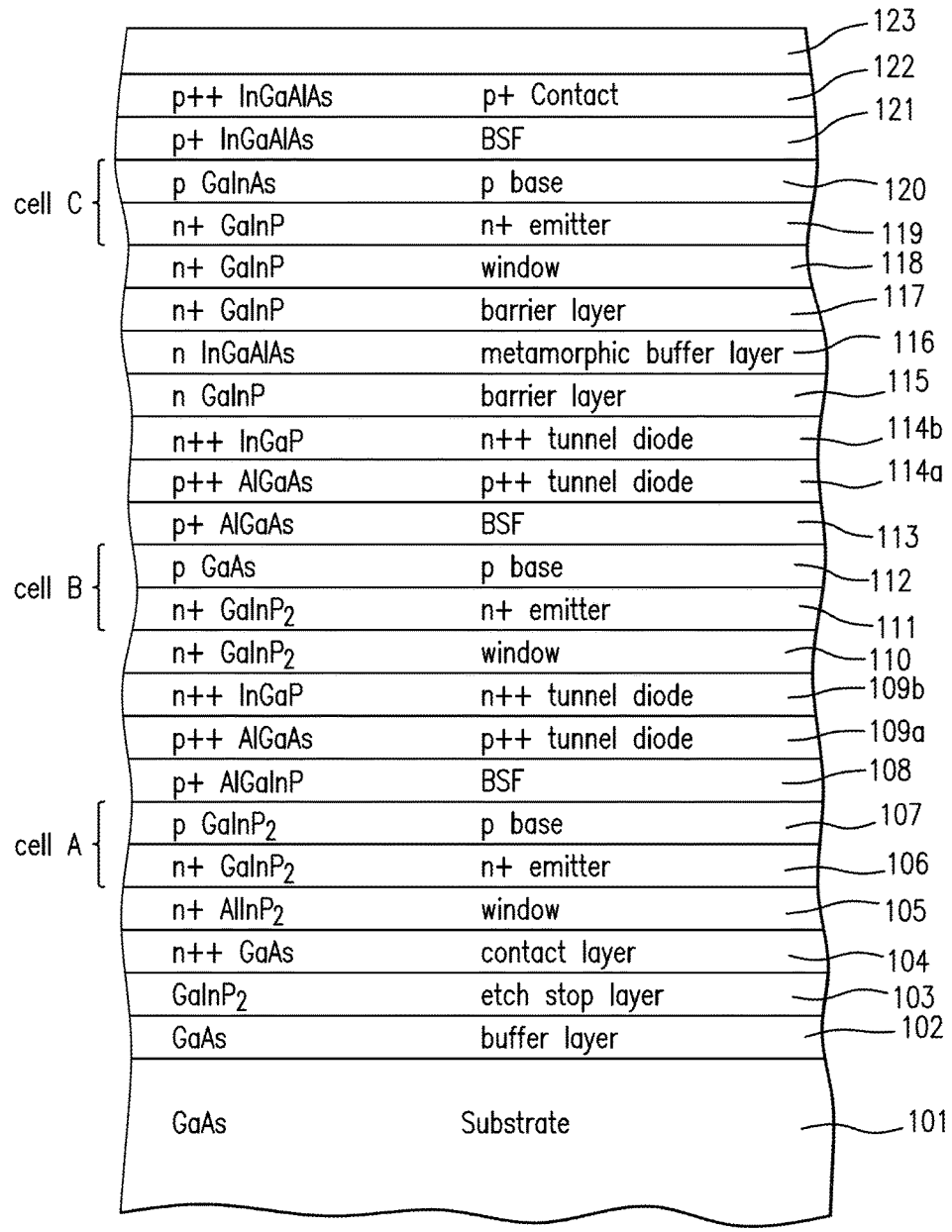
FIG. 7 is a cross-sectional view of the solar cell of FIG. 6 after the next process step of depositing the laminate structure according to the present disclosure.

FIG. 7 is a cross-sectional view of the solar cell of FIG. 2 after the next process step in which the laminate structure 123 is deposited over the p+ semiconductor contact layer 122.

During subsequent processing steps, the semiconductor body and its associated metal layers and bonded structures will go through various heating and cooling processes, which may put stress on the surface of the semiconductor body.

Figure 8:
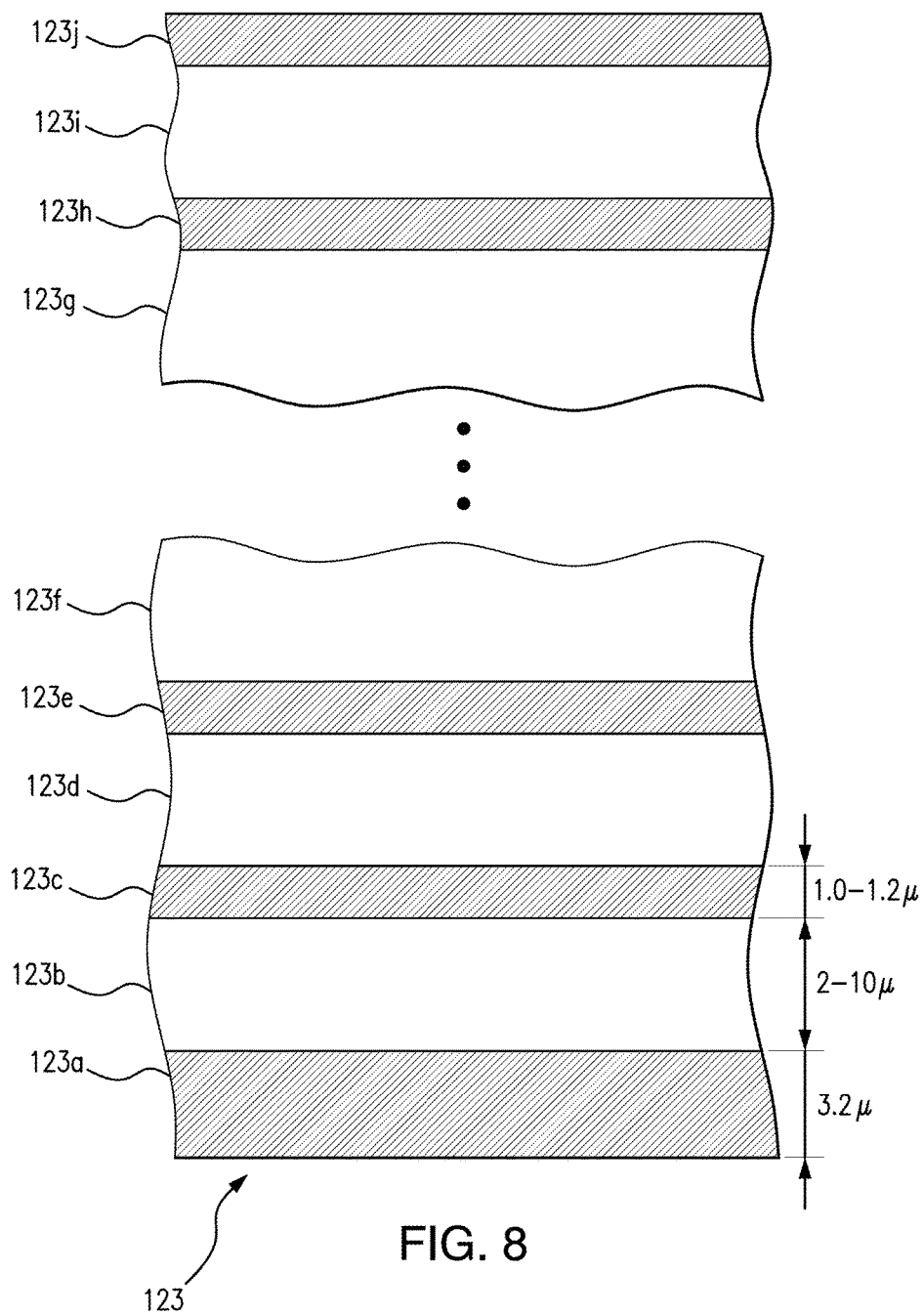
FIG. 8 is an enlarged cross-sectional view of the top layers of the solar cell of FIG. 7 forming a laminate structure according to the present disclosure.

FIG. 8 is a cross-sectional view of the laminate structure 123 in greater detail, although for simplicity we represent the laminate structure 123 in subsequent figures with all-metal cross-hatching. As we noted above in connection with FIG. 1B, the laminate structure 123 according to the present disclosure in some embodiments may be about 30 microns in thickness to achieve the required rigidity and performance during subsequent processing. In some embodiments, the metal 123c, etc. in the laminate structure is between 1.0 and 2.0 microns in thickness, and the metal 123a in the laminate structure is about 3.2 microns in thickness, and the bonding layer 123b, 123d, etc. in the laminate structure is between 2.0 and 10.0 microns in thickness.

Alternatively, in some embodiments, the laminate structure 123 may be composed of alternating metal and bonding layers with different thickness parameters for certain applications or customer requirements, or may have a total thickness in the range of 25 to 40 microns.

Figure 9:
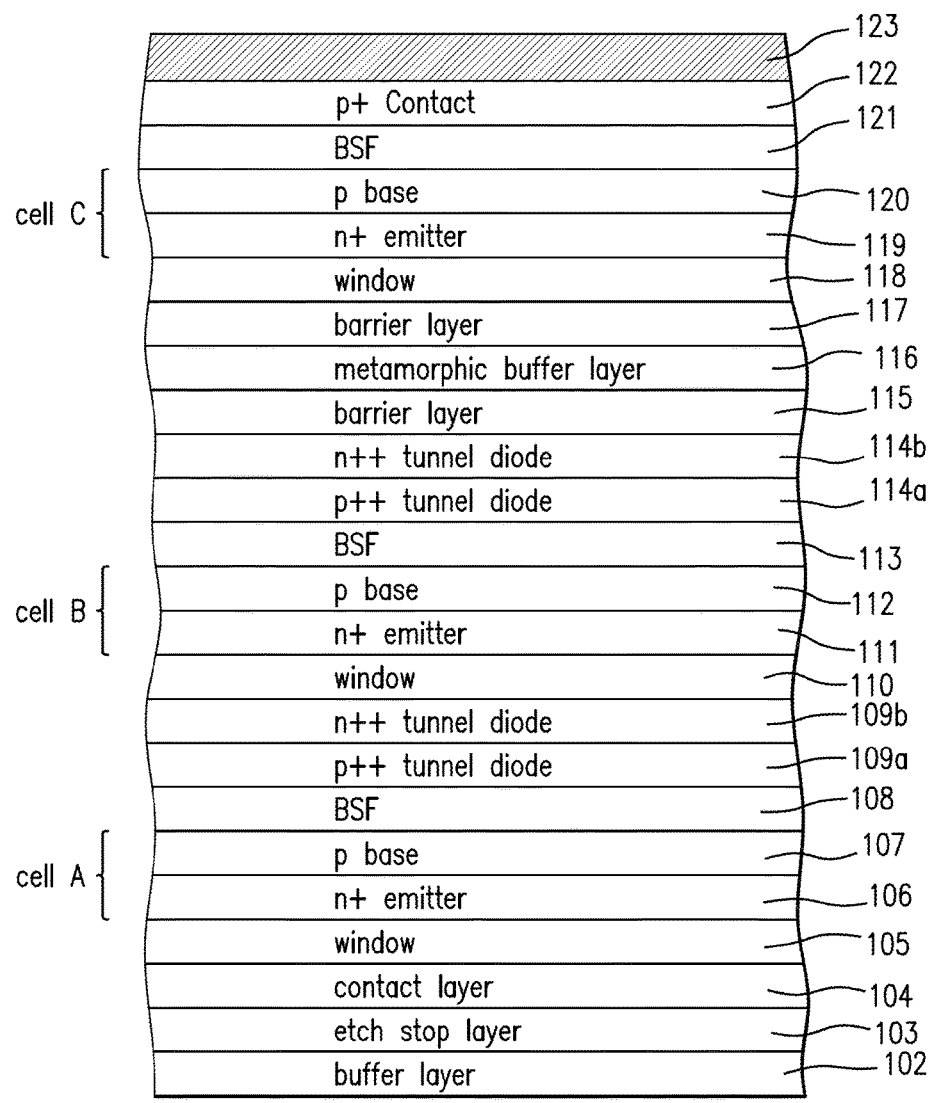
FIG. 9 is a cross-sectional view of the solar cell of FIG. 8 after the next process step.

FIG. 9 is a cross-sectional view of the solar cell of FIG. 7 after the next process step in which the original substrate is removed. In some embodiments, the substrate 101 may be removed by a sequence of lapping, grinding and/or etching steps in which the substrate 101, and the buffer layer 103 are removed. The choice of a particular etchant is growth substrate dependent. In other embodiments, the substrate may be removed by a lift-off process such as described in U.S. patent application Ser. No. 12/367,991, filed Feb. 9, 2009, or U.S. Pat. No. 8,778,199, hereby incorporated by reference.

Figure 10:
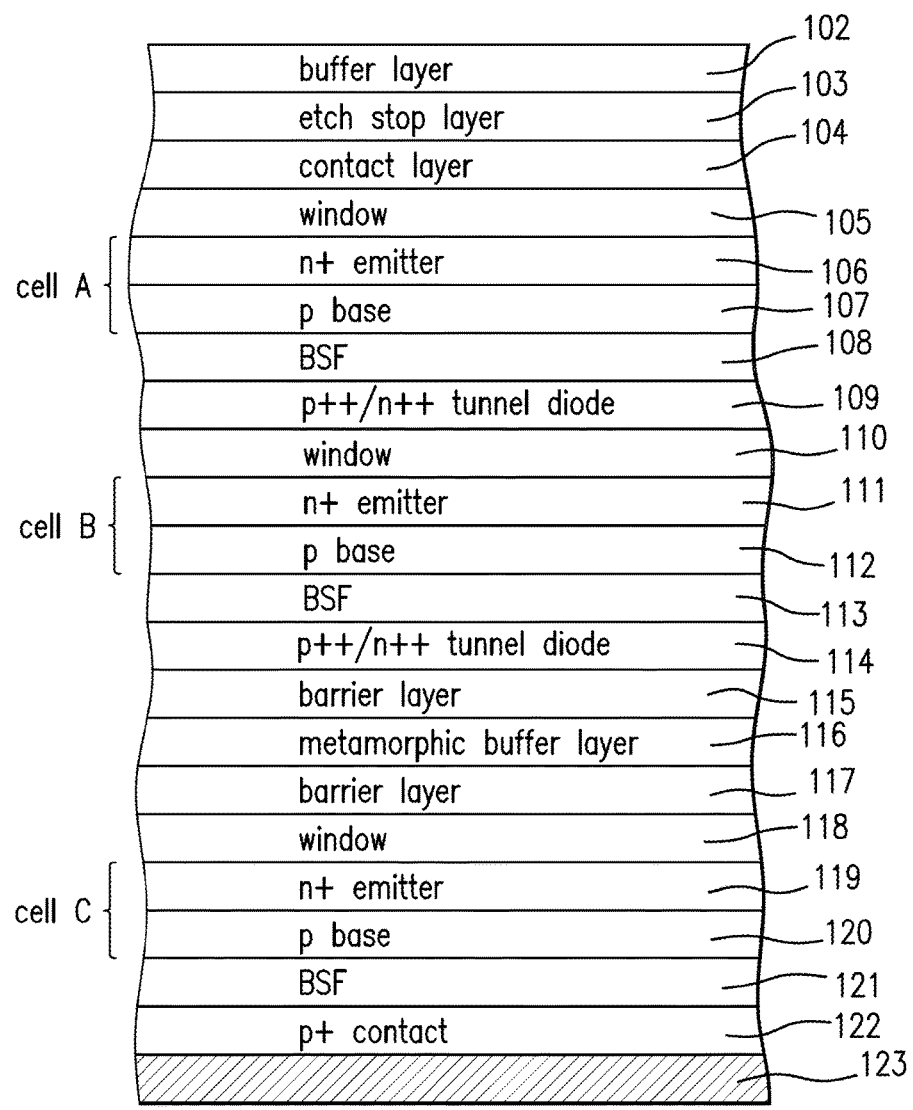
FIG. 10 is another cross-sectional view of the solar cell of FIG. 9 depicted with the laminate structure according to the present disclosure on the bottom of the Figure.

FIG. 10 is a cross-sectional view of the solar cell of FIG. 9 with the orientation with the laminate structure 123 being positioned at the bottom of the Figure. Subsequent Figures in this application will assume such orientation.

Figure 11:
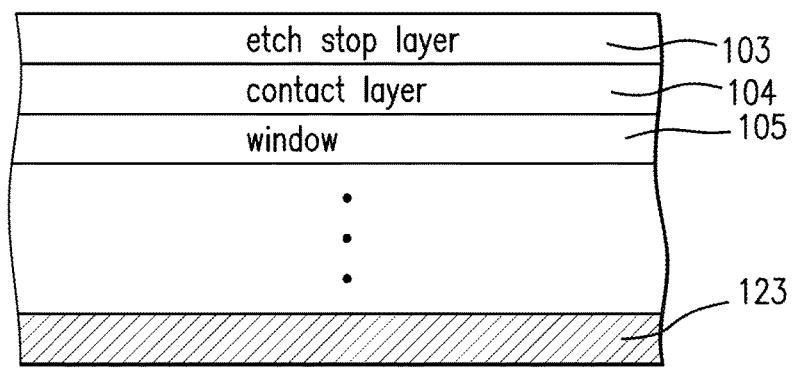
FIG. 11 is a simplified cross-sectional view of the solar cell of FIG. 10 after the next process step.

FIG. 11 is a simplified cross-sectional view of the solar cell of FIG. 10 depicting just a few of the top layers and lower layers over the laminate structure 123.

Figure 12:
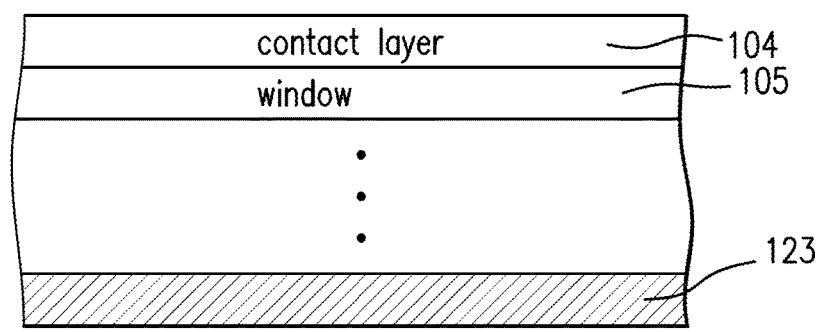
FIG. 12 is a cross-sectional view of the solar cell of FIG. 11 after the next process step.

FIG. 12 is a cross-sectional view of the solar cell of FIG. 11 after the next process step in which the etch stop layer 103 is removed by a HCl/H$_2$O solution.

Figure 13:
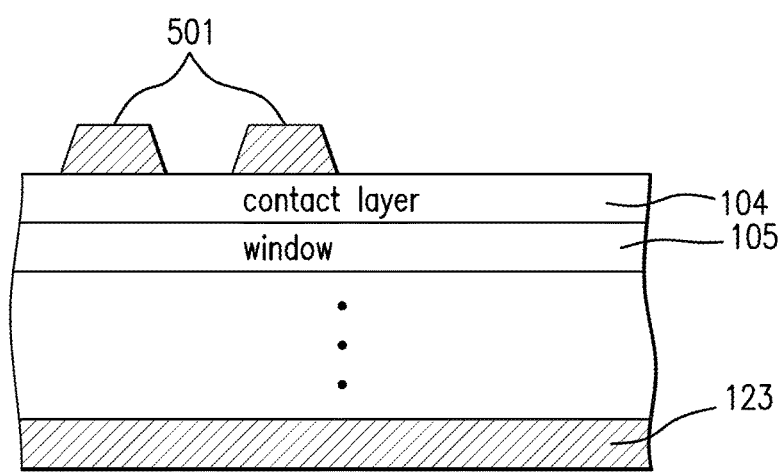
FIG. 13 is a cross-sectional view of the solar cell of FIG. 12 after the next process step.

FIG. 13 is a cross-sectional view of the solar cell of FIG. 12 after the next sequence of process steps in which a photoresist mask (not shown) is placed over the contact layer 104 to form the grid lines 501. As will be described in greater detail below, the grid lines 501 are deposited via evaporation and lithographically patterned and deposited over the contact layer 104. The mask is subsequently lifted off to form the finished metal grid lines 501 as depicted in the Figures.

As more fully described in U.S. patent application Ser. No. 12/218,582 filed Jul. 18, 2008, hereby incorporated by reference, the grid lines 501 may be composed of the sequence of layers Pd/Ge/Ti/Pd/Au, Pd/Ge/Ti/Pd/Ag/Au, or other suitable sequences and materials.

Figure 14:
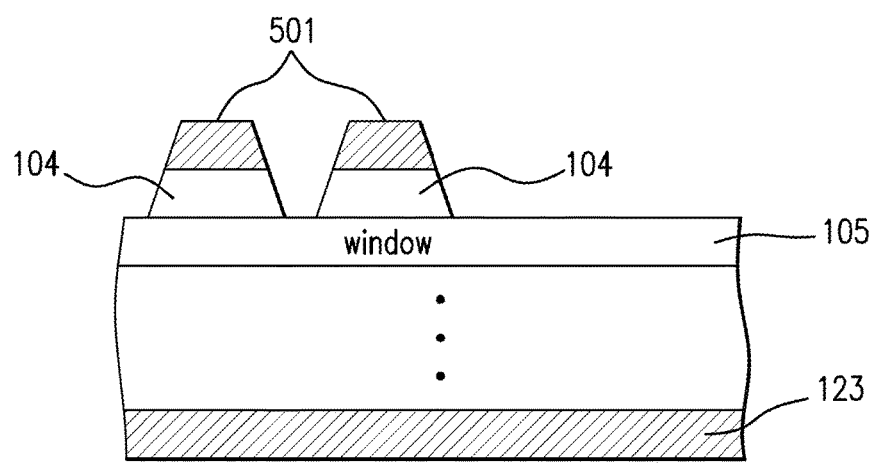
FIG. 14 is a cross-sectional view of the solar cell of FIG. 13 after the next process step.

FIG. 14 is a cross-sectional view of the solar cell of FIG. 13 after the next process step in which the grid lines are used as a mask to etch down the surface to the window layer 105 using a citric acid/peroxide etching mixture. An antireflective (ARC) dielectric coating layer (not shown) me be applied over the entire surface of the "top" side of the wafer with the grid lines 501.

Figure 15:
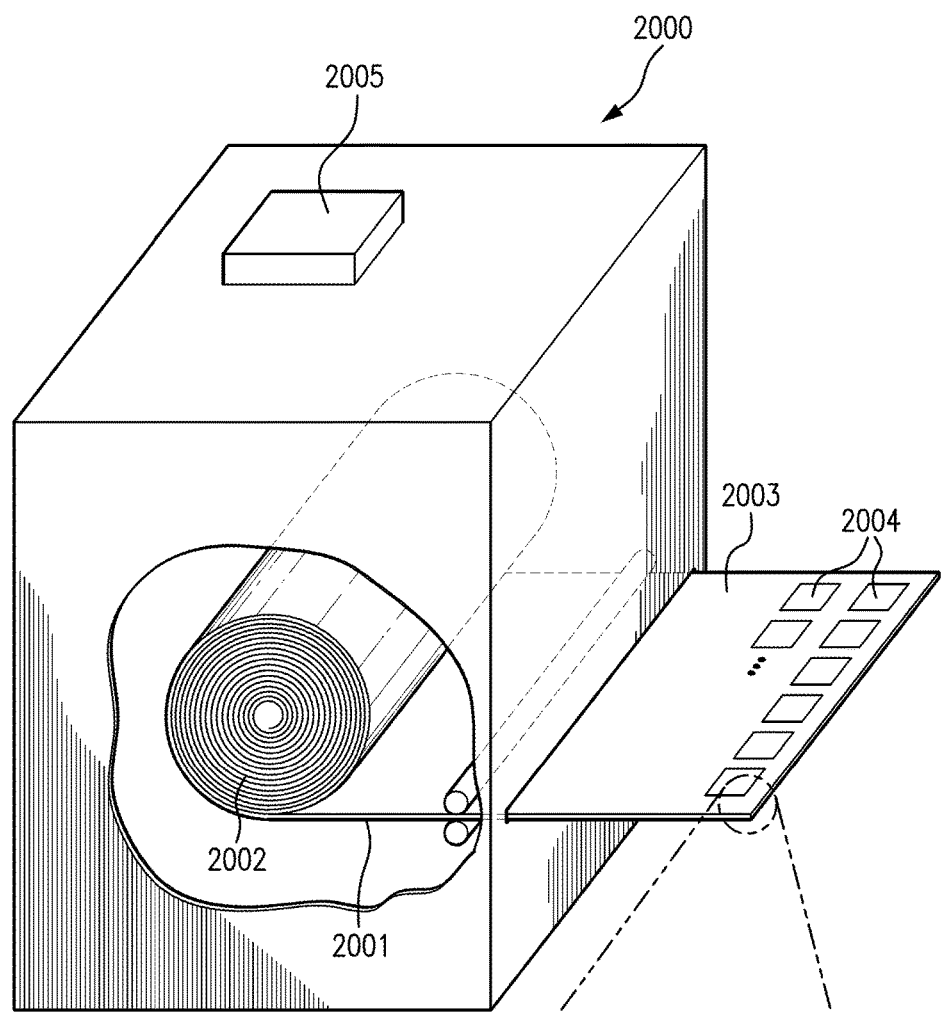
FIG. 15 is a highly simplified perspective view of a space vehicle incorporating an array in which the solar cell assemblies incorporate the laminate structure according to the present disclosure.
Figure 15:
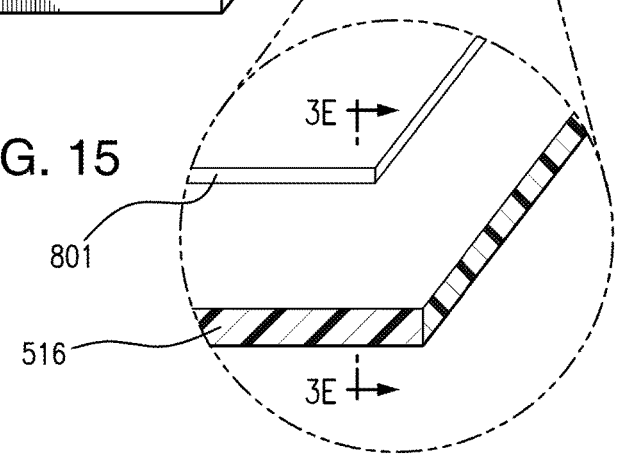

FIG. 15 is a highly simplified perspective view of a space vehicle 2000 incorporating an array of solar cell assemblies 2004 mounted on a deployable flexible sheet 2003 in which the solar cell assemblies 2004 incorporate the laminate structure according to the present disclosure. The sheet 2003 may wrap around a mandrel 2002. The space vehicle 2000 includes a payload 2005 which is powered by the array of solar cell assemblies 2004.

It will be understood that each of the elements described above, or two or more together, also may find a useful application in other types of constructions differing from the types of constructions described above.

Although some of the embodiments of the present disclosure utilizes a vertical stack of three subcells, the present disclosure can apply to stacks with fewer or greater number of subcells, i.e. two junction cells, four junction cells, five junction cells, etc. as more particularly described in U.S. patent application Ser. No. 12/267,812 filed Nov. 10, 2008. In the case of four or more junction cells, the use of more than one metamorphic grading interlayer may also be utilized, as more particularly described in U.S. patent application Ser. No. 12/271,192 filed Nov. 14, 2008.

In addition, although in some embodiments the solar cell is configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, embodiments of the present disclosure may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n-type InGaP is one example of a homojunction subcell. Alternatively, as more particularly described in U.S. patent application Ser. No. 12/023,772 filed Jan. 31, 2008, and U.S. Pat. No. 8,895,342, the present invention may utilize one or more, or all, heterojunction cells or subcells, i.e., a cell or subcell in which the p-n junction is formed between a p-type semiconductor and an n-type semiconductor having different chemical compositions of the semiconductor material in the n-type regions, and/or different band gap energies in the p-type regions, in addition to utilizing different dopant species and type in the p-type and n-type regions that form the p-n junction.

In some embodiments, a thin so-called "intrinsic layer" may be placed between the emitter layer and base layer of some subcells, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness. Some such configurations are more particularly described in copending U.S. patent application Ser. No. 12/253,051 filed Oct. 16, 2008.

The composition of the window or BSF layers may utilize other semiconductor compounds, subject to lattice constant and band gap requirements, and in some embodiments may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present disclosure.

While the disclosure illustrates and describes the embodiment of a laminate structure for use in the fabrication of an inverted metamorphic multijunction solar cell, it is not intended to be limited to the details shown, since various modifications and structural changes may be made without departing in any way from the spirit of the present disclosure.

Thus, while the description of this disclosure has focused primarily on solar cells or photovoltaic devices, persons skilled in the art know that other optoelectronic devices, such as, thermophotovoltaic (TPV) cells, photodetectors and light-emitting diodes (LEDS) are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, the foregoing will so fully reveal the gist of the present disclosure that others can, by applying current knowledge, readily adapt it for various applications without omitting features that, from the standpoint of prior art, fairly constitute essential characteristics of the generic or specific aspects of this disclosure and, therefore, such adaptations should and are intended to be comprehended within the meaning and range of equivalence of the following claims.

The invention claimed is:

1. A method of manufacturing a solar cell comprising:
providing a growth substrate;
depositing on the growth substrate an epitaxial sequence of layers of semiconductor material forming subcells of a multijunction solar cell,
depositing a laminate structure having a thickness of 50 microns or less including a bottom metal contact layer and a sequence of supporting layers separated by bonding layers over the sequence of layers of semiconductor material, wherein the laminate structure has a weight of less than 11.0 mg per square centimeter; and
removing the first substrate.

2. A method as defined in claim 1, wherein the laminate structure is composed of an alternating sequence of a metal layer and a bonding layer.

3. A method as defined in claim 2, wherein each of the metal layers in the laminate structure below the bottom metal contact layer are between 1.0 and 2.0 microns in thickness, and the each of the bonding layers in the laminate structure are between 2.0 and 10.0 microns in thickness.

4. A method as defined in claim 1, wherein the bottom metal layer is composed of a sequence of metal layers including titanium, gold and silver applied by an evaporative deposition or sputtering process.

5. A method as defined in claim 1, further comprising utilizing the laminate structure for supporting the epitaxial sequence of layers of semiconductor material forming a solar cell during subsequent processing steps including depositing and lithographically patterning a plurality of metal grid lines disposed on the top surface of the top solar subcell, and attaching a cover glass supporting member over the metal grid lines including a ceria glass having a thickness of about 4 mils.

6. A method as defined in claim 1, wherein the laminate structure provides sufficient rigidity and support of the sequence of layers of semiconductor material forming a solar cell during the removal of the growth substrate by a process including grinding or lapping to remove over 80% of the thickness of the growth substrate, followed by an etching step to remove the remaining portion of the growth substrate.

7. A method as defined in claim 1, wherein said step of depositing a sequence of layers of semiconductor material includes forming a first solar subcell on said substrate having a first band gap; forming a second solar subcell over said first subcell having a second band gap smaller than said first band gap; forming a grading interlayer over said second subcell having a third band gap larger than said second band gap; forming a third solar subcell over said grading interlayer having a fourth band gap smaller than said second band gap such that said third subcell is lattice mismatched with respect to said second subcell, and the graded interlayer is compositionally graded to lattice match the second subcell on one side and the third subcell on the other side.

8. A method as defined in claim 7, wherein the graded interlayer is composed of $(In_xGa_{1-x})_yAl_{1-y}As$, with $0<x<1$ and $0<y<1$, and selected such that the band gap of the interlayer material remains constant throughout its thickness.

9. A method as defined in claim 7, wherein the band gap of the interlayer material remains constant at a predetermined value in the range of 1.6 eV±3% throughout its thickness.

10. A method as defined in claim 1, wherein said first substrate is composed of GaAs.

11. A method as defined in claim 7, wherein said first solar subcell is composed of an InGa(Al)P emitter region and an InGa(Al)P base region.

12. A method as defined in claim 7, wherein said second solar subcell is composed of an InGaP emitter region and a GaAs base region.

13. A method as defined in claim 7, wherein said third solar subcell is composed of InGaAs.

14. A method of manufacturing a solar cell comprising:
providing a growth substrate;
depositing on the growth substrate an epitaxial sequence of layers of semiconductor material forming subcells of a multijunction solar cell,
depositing a laminate structure having a thickness of 50 microns or less including a bottom metal contact layer and a sequence of supporting layers separated by bonding layers over the sequence of layers of semiconductor material, wherein the laminate structure is composed of an alternating sequence of bonding layer and a carbon fiber layer deposited over the bottom metal contact layer; and removing the first substrate.

15. A method of manufacturing a solar cell comprising:
providing a growth substrate;
depositing on the growth substrate an epitaxial sequence of layers of semiconductor material forming subcells of a multijunction solar cell,
depositing a laminate structure having a thickness of 50 microns or less including a bottom metal contact layer and a sequence of supporting layers separated by bonding layers over the sequence of layers of semiconductor material, wherein the laminate structure is composed of an alternating sequence of a metal layer and a bonding layer, wherein the metal layer in the laminate structure is composed of titanium and the bonding layer is a polyimide, and the thickness of each of the bonding layers is at least twice that of each of the metal layers in the laminate structure below the bottom metal contact layer, and wherein each of the metal layers in the laminate structure below the bottom metal contact layer are between 1.0 and 2.0 microns in thickness, and the each of the bonding layers in the laminate structure are between 2.0 and 10.0 microns in thickness; and
removing the first substrate.

16. A method of manufacturing a solar cell assembly comprising:
providing a growth substrate;
depositing on the growth substrate using an MOCVD process a sequence of layers of semiconductor material forming a solar cell, including forming a first solar subcell having a first band gap; forming a second solar subcell over said first subcell having a second band gap smaller than said first band gap; forming a grading interlayer over said second subcell having a third band gap larger than said second band gap and is compositionally graded to lattice match the middle subcell on one side and the bottom subcell on the other side, is composed of $(In_xGa_{1-x})_y Al_{1-y}As$ with $0<x<1$ and $0<y<1$, and selected such that the band gap of the interlayer material remains constant throughout its thickness; and forming a third solar subcell having a fourth band gap smaller than said second band gap such that said third subcell is lattice mismatched with respect to said second subcell;
mounting a supporting member on top of the sequence of layers including a bottom metal contact layer and a laminate structure directly adjacent to the contact layer and having a thickness in the range of 30 to 60 microns or less and a weight of less than 11.0 mg per square centimeter;
removing the growth substrate;
utilizing the laminate structure for supporting the epitaxial sequence of layers of semiconductor material forming a solar cell during subsequent processing steps including depositing and lithographically patterning a plurality of metal grid lines disposed on the top surface of the first solar subcell, including at least one metal contact pad electrically connected to said grid lines and disposed adjacent to a first peripheral edge of said first solar subcell;
providing a metal interconnection member with a first end portion;
bonding the metal interconnection member to the first terminal; and
attaching a glass supporting member over at least the grid lines of the first solar subcell.

17. A method as defined in claim 16, further comprising attaching a plurality of interconnected solar cell assemblies to a flexible film by an adhesive to form an array of solar cells; depositing a metal contact layer adjacent to said third solar subcell for making an electrical contact thereto; and forming a cut-out extending from a second peripheral edge of the solar cell opposite from said first edge and along the top surface of the solar cell to the metal contact layer; bonding a discrete metal interconnection member to the metal contact layer through the cut-out, wherein the discrete metal interconnection member is a planar rectangular clip having a first end-portion welded to the metal contact layer, a second portion connected to the first end-portion and extending through the cut-out and above the surface of the solar cell, and a third portion connected to the second portion and being serpentine in shape, and welding the third portion of the metal interconnection member to a terminal of opposite polarity of an adjacent solar cell to thereby form an electrical series connection.

* * * * *